United States Patent
Kim et al.

(10) Patent No.: US 11,121,186 B2
(45) Date of Patent: Sep. 14, 2021

(54) TRANSPARENT DISPLAY DEVICE INCLUDING A TRANSMISSIVE ELECTRODE AND A CAPPING STRUCTURE AT AN EMISSION PORTION AND A TRANSMISSION PORTION

(71) Applicant: LG Display Co., Ltd., Seoul (KR)

(72) Inventors: Jae-Hyeon Kim, Paju-si (KR);
Eun-Jung Park, Goyang-si (KR);
Kwan-Soo Kim, Paju-si (KR);
Seok-Hyun Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/730,275

(22) Filed: Dec. 30, 2019

(65) Prior Publication Data
US 2020/0212130 A1 Jul. 2, 2020

(30) Foreign Application Priority Data

Dec. 31, 2018 (KR) .......................... 10-2018-0173661

(51) Int. Cl.
*H01L 27/32* (2006.01)
*H01L 51/52* (2006.01)

(52) U.S. Cl.
CPC ...... *H01L 27/3218* (2013.01); *H01L 27/3246* (2013.01); *H01L 51/5218* (2013.01); *H01L 51/5234* (2013.01); *H01L 51/5253* (2013.01)

(58) Field of Classification Search
CPC ............. H01L 27/3218; H01L 27/3246; H01L 51/5253; H01L 51/5234; H01L 51/5218
See application file for complete search history.

(56) References Cited

U.S. PATENT DOCUMENTS

| 8,274,090 | B2 | 9/2012 | Choi et al. |
| 8,436,338 | B2 * | 5/2013 | Gregory .............. H01L 27/3246 |
| | | | 257/40 |
| 9,419,244 | B2 | 8/2016 | Lang et al. |
| 9,685,633 | B2 | 6/2017 | Lang et al. |
| 9,928,777 | B2 | 3/2018 | Kim et al. |
| 9,954,036 | B2 | 4/2018 | Sato |
| 10,236,465 | B2 | 3/2019 | Ushikubo |
| 10,263,047 | B2 | 4/2019 | Sato |
| 2011/0084291 | A1 | 4/2011 | Seong et al. |

(Continued)

FOREIGN PATENT DOCUMENTS

| CN | 107564937 A | 1/2018 |
| JP | 2000-275859 A | 10/2000 |

(Continued)

OTHER PUBLICATIONS

Japan Patent Office, Office Action, JP Patent Application No. 2019-234040, dated Jan. 12, 2021, 14 pages.
German Office Action, DE Patent Application No. 10 2019 135 788.8, dated Jun. 1, 2021, 25 pages.

(Continued)

*Primary Examiner* — Quoc D Hoang
(74) *Attorney, Agent, or Firm* — Fenwick & West LLP

(57) ABSTRACT

Disclosed is a transparent display device which has improved transmittance and luminous uniformity according to wavelength. The transparent display device includes a capping structure. The capping structure is formed by stacking a high refractive index first capping layer having destructive interference properties and a low refractive index second capping layer.

20 Claims, 22 Drawing Sheets

(56) References Cited

U.S. PATENT DOCUMENTS

| | | | |
|---|---|---|---|
| 2012/0049206 A1 | 3/2012 | Choi et al. | |
| 2014/0138636 A1 | 5/2014 | Song | |
| 2015/0129846 A1 | 5/2015 | Lang et al. | |
| 2015/0187847 A1 | 7/2015 | Choi | |
| 2016/0099438 A1* | 4/2016 | Cho | H01L 51/5275 257/40 |
| 2016/0126295 A1 | 5/2016 | Sato | |
| 2016/0322605 A1 | 11/2016 | Lang et al. | |
| 2017/0125744 A1 | 5/2017 | Kim et al. | |
| 2018/0005574 A1 | 1/2018 | Kim et al. | |
| 2018/0090706 A1 | 3/2018 | Ushikubo | |
| 2018/0212000 A1 | 7/2018 | Sato | |
| 2019/0043931 A1* | 2/2019 | Yim | H01L 51/5275 |
| 2019/0148648 A1* | 5/2019 | Lee | H01L 51/5024 257/40 |

FOREIGN PATENT DOCUMENTS

| | | |
|---|---|---|
| JP | 2005-107137 A | 4/2005 |
| JP | 2008-070459 A | 3/2008 |
| JP | 2010-102983 A | 5/2010 |
| JP | 2012-204328 A | 10/2012 |
| JP | 2015-520485 A | 7/2015 |
| JP | 2016-090812 A | 5/2016 |
| JP | 2018-049983 A | 3/2018 |
| KR | 10-2012-0019025 A | 3/2012 |
| KR | 10-1702570 B1 | 2/2017 |

OTHER PUBLICATIONS

Japan Patent Office, Notice of Reasons for Refusal, JP Patent Application No. 2019-234040, dated May 11, 2021, six pages.

\* cited by examiner

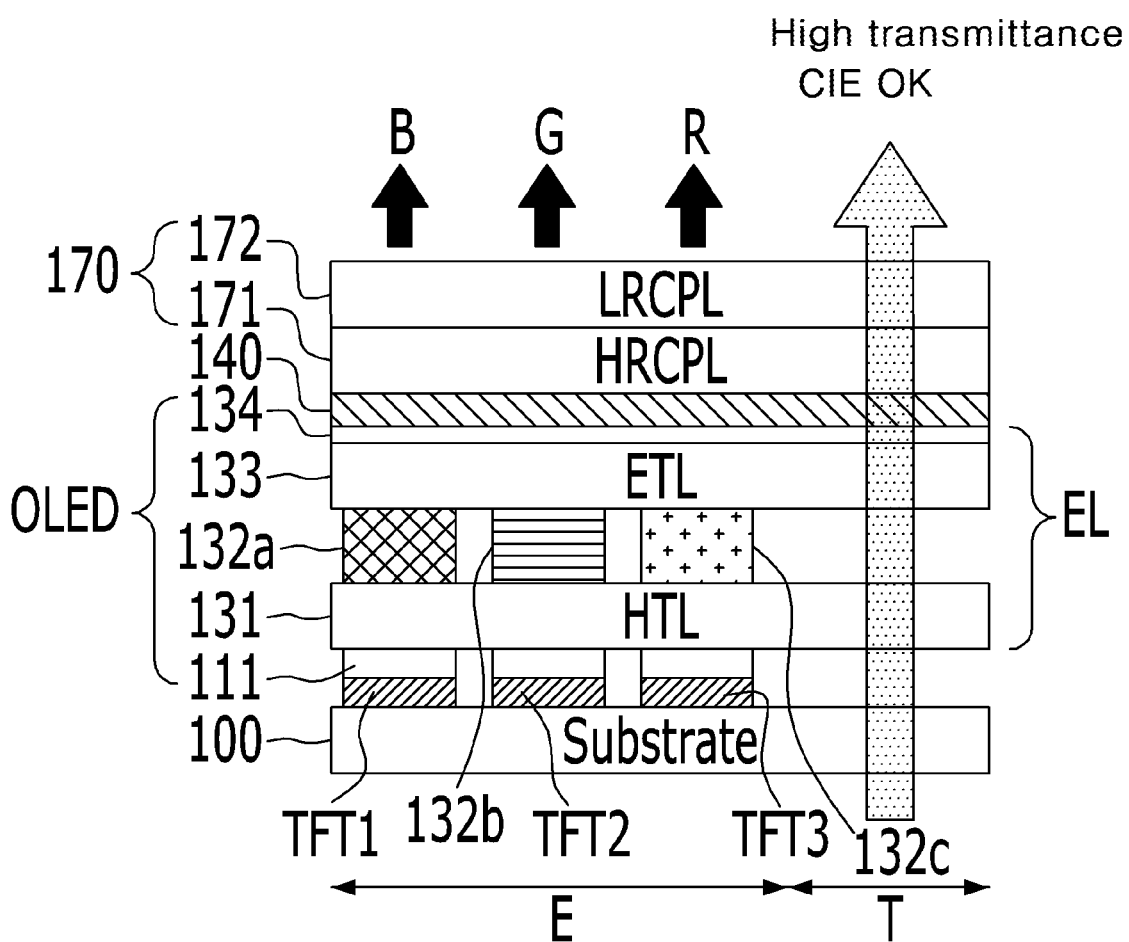

all light transmitted into object no light transmitted into object

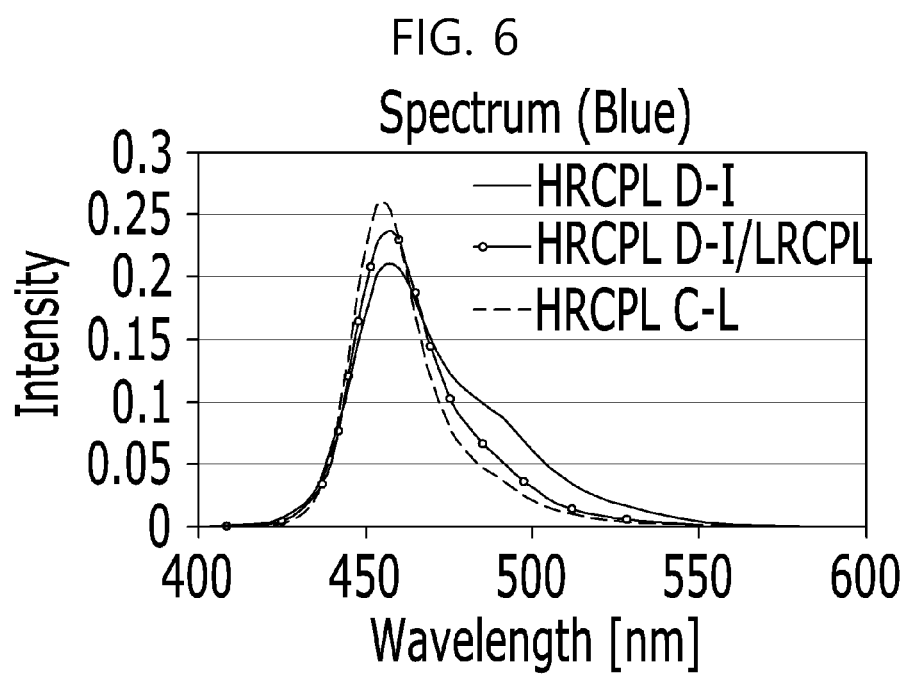

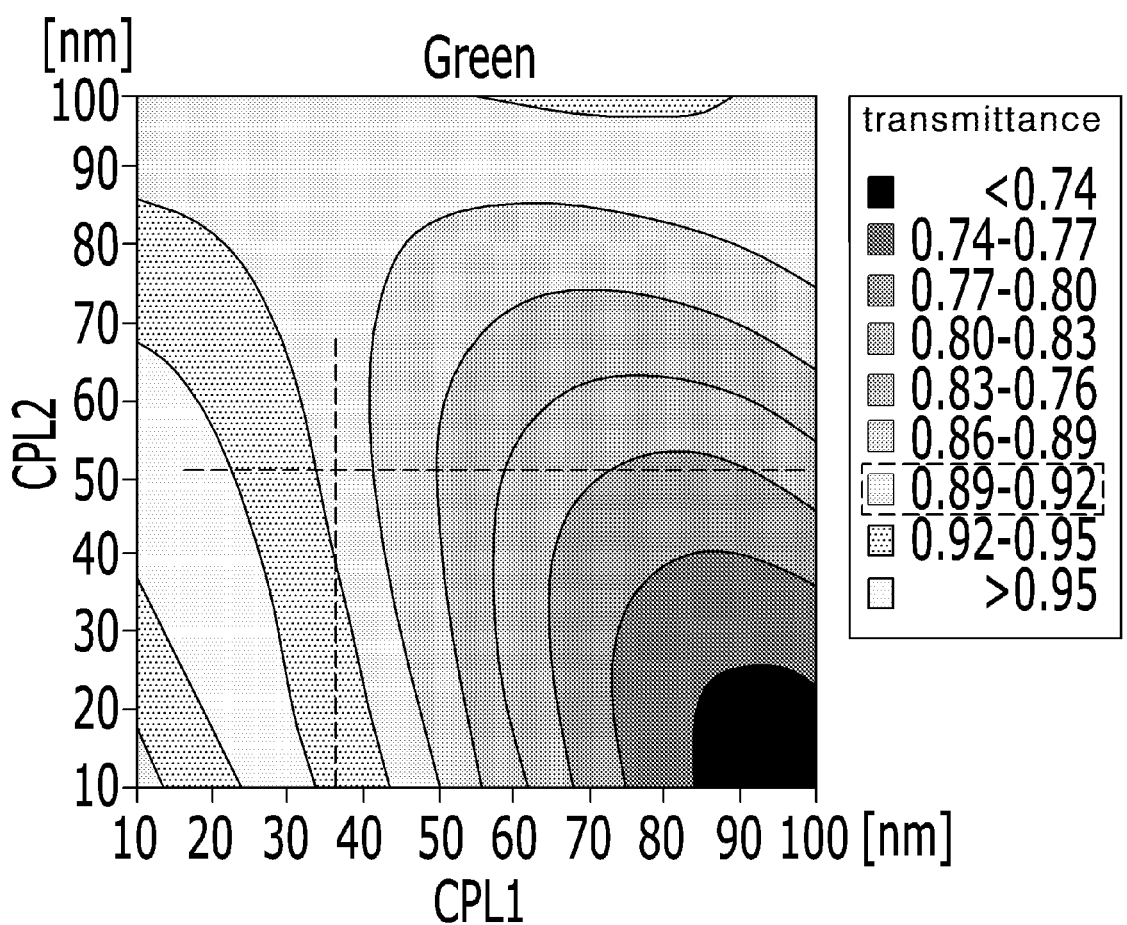

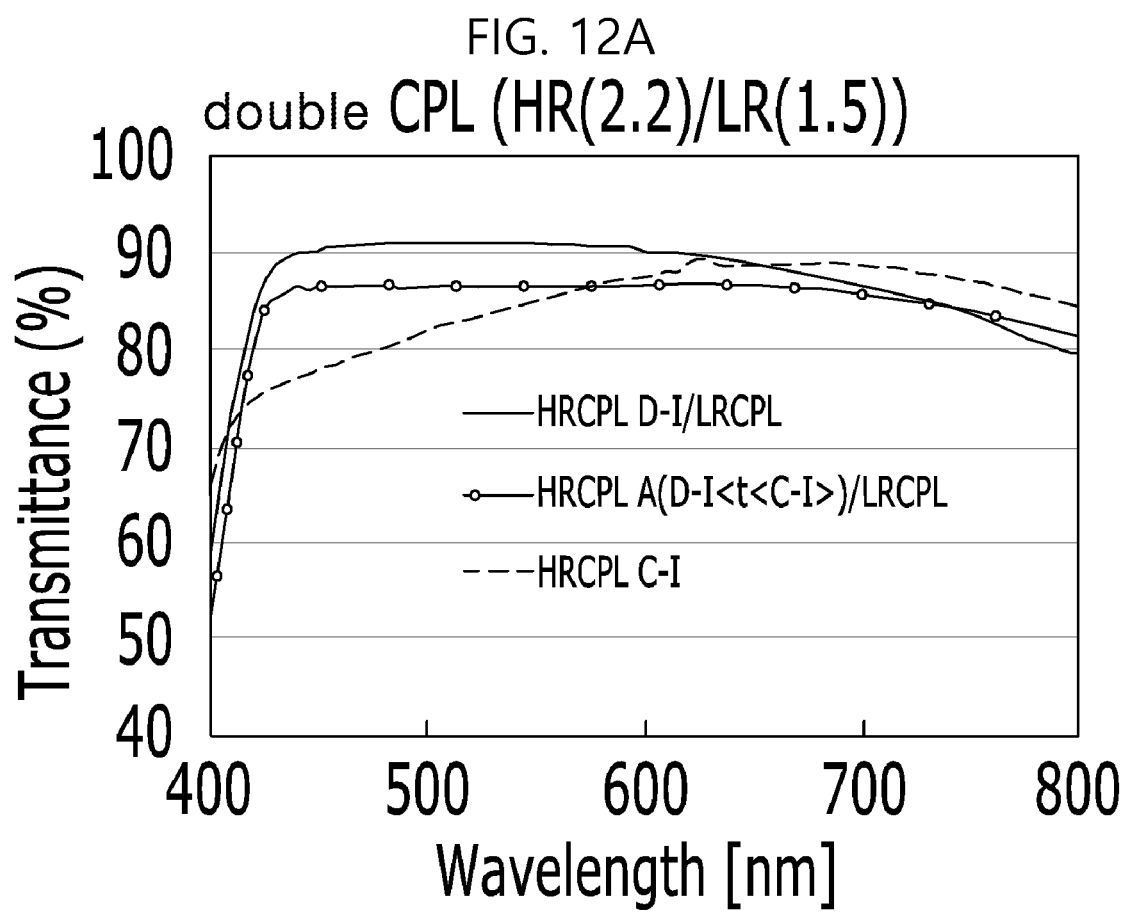

TRANSPARENT DISPLAY DEVICE INCLUDING A TRANSMISSIVE ELECTRODE AND A CAPPING STRUCTURE AT AN EMISSION PORTION AND A TRANSMISSION PORTION

CROSS-REFERENCE TO RELATED APPLICATIONS

This application claims the benefit of Republic of Korea Patent Application No. 10-2018-0173661, filed on Dec. 31, 2018, which is hereby incorporated by reference as if fully set forth herein.

BACKGROUND

Field

The present disclosure relates to a display device, and more particularly, to a transparent display device which has improved transmittance and luminous uniformity according to wavelength.

Discussion of the Related Art

As we have recently entered the information age, the field of displays which visually display electrical information signals has been rapidly developed and, in order to satisfy such development, various flat display devices having excellent performance, such as thinness, light weight and low power consumption, are being developed and rapidly replacing conventional cathode ray tubes (CRTs).

As examples of flat display devices, there are a liquid crystal display (LCD) device, a plasma display panel (PDP) device, a field emission display (FED) device, an organic light emitting diode (OLED) display device, a quantum dot display device, etc.

Thereamong, self-luminous display devices which do not require separate light sources and achieve compactness and clear color display, such as an organic light emitting diode display device and a quantum dot display device, are considered as competitive applications.

A self-luminous display device includes a plurality of pixels over a substrate, and each pixel includes a light emitting diode including an anode and a cathode disposed opposite to each other and a light emitting layer provided between the anode and the cathode.

Since the self-luminous display device displays an image using light emitted by the light emitting diodes, it is important to effectively use light extracted from the light emitting diodes. Therefore, an effort to reduce the thickness of the cathode located in a light emitting direction so as to increase transmittance and an effort to raise reliability of the cathode and elements disposed adjacent thereto so as to stabilize performance of the display device have been made.

In a top emission structure which is used now, for example, an anode of a light emitting device includes a reflective metal, and a cathode of the light emitting device includes a transflective metal. Therefore, light emitted from a light emitting layer located between the anode and the cathode is reflected by the reflective anode and resonates a plurality of times between the anode and the cathode, and light of a specific wavelength according to a distance between the anode and the cathode is emitted. In such a structure, in order to further increase transmittance, an effort to reduce the thickness of the cathode is made.

Further, demand for a transparent display device which may transmit light through front and rear surfaces thereof and display an image without obstruction of a visual field is increasing now.

The transparent display device varies disposition of light emitting diodes in a self-luminous area and a transparent area and may thus acquire both a transparent display effect and a luminous display effect.

However, since the self-luminous area and the transparent area respectively regard increase in luminous efficiency and transmittance as important, the self-luminous area and the transparent area have different purposes and thus require different structures, and thereby it is difficult to implement the self-luminous area and the transparent area through a common formation method.

Further, if both the self-luminous area and the transparent area are provided over a substrate, the transparent area requires omission of some elements so as to increase transmittance, as compared to elements of the self-luminous area, an emission area is reduced in proportion to the transparent area, and driving voltage required to emit light of a designated luminance or more through only the reduced emission area is high.

Recently, in a transparent display device, in order to increase transmittance, the thickness of an electrode or a capping layer located in the light emitting direction is decreased, and, in this case, deviations among intensities of light emitted from emission areas according to wavelength occur and thus color purity is lowered and color efficiency is reduced.

That is, it is difficult for transparent display devices which have been proposed up to now, to have high transmittance and uniform color efficiency according to wavelength.

SUMMARY

Accordingly, the present disclosure is directed to a transparent display device that substantially obviates one or more problems due to limitations and disadvantages of the related art.

An object of the present invention is to provide a transparent display device which may have both a transparent display effect and a luminous display effect and thereby have improved transparency and uniformity in color efficiency according to wavelength.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the disclosure, as embodied and broadly described herein, a transparent display device includes a substrate having a plurality of pixels, an emission portion and a transmission portion in each of the pixels, an organic light emitting layer in the emission portion, a reflective electrode structure provided between the organic light emitting layer and the substrate, in the emission portion, a transmissive electrode over the organic light emitting layer, throughout the pixels over the substrate, and a capping structure including a first capping layer over the transmissive electrode and having destructive interference properties and a first refractive index of 2.0 or more, and a second capping layer over the first capping layer and having a second refractive index less than the first refractive index by 0.2 or more but less than 1.2.

The first refractive index may be 2.0 to 2.7, and the second refractive index may be 1.3 to 2.0.

The first capping layer may have a first thickness ($d_1$), and a first optical distance ($n_1 d_1$) of the first capping layer may have a value of $m\lambda/2 \cos \theta$ (m being an integral, $\lambda$ being a destructively interfered wavelength and $\theta$ being an angle of incidence).

The destructively interfered wavelength may be a blue wavelength.

A peak wavelength of the destructively interfered wavelength may be in the range of 430 nm to 465 nm.

The second capping layer may have a second thickness ($d_2$), and a second optical distance ($n_2 d_2$) of the second capping layer may be 0.9 to 1.1 times the first optical distance ($n_1 d_1$).

A difference between reflectance of an upper surface of the second capping layer and reflectance of an interface between the first capping layer and the second capping layer may be within 5%.

The transparent display device may further include an encapsulation layer over the second capping layer and having a small refractive index change according to wavelength, which is 0.2 or less, in a visible wavelength range.

Reflectance of an upper surface of the second capping layer may be $$\left( \frac{n_2 \cos\theta_i - n_{Encap} \cos\theta_t}{n_2 \cos\theta_i + n_{Encap} \cos\theta_t} \right)^2$$

($n_{Encap}$ being a refractive index of an element located over the second capping layer, $\theta_i$ being an angle of incidence and $\theta_t$ being an angle of exit).

Reflectance reflectance of an interface between the first capping layer and the second capping layer may be $$\left( \frac{n_1 \cos\theta_i - n_2 \cos\theta_t}{n_1 \cos\theta_i + n_2 \cos\theta_t} \right)^2$$

($\theta_i$ being an angle of incidence and $\theta_t$ being an angle of exit), and difference between the reflectance of the interface between the first capping layer and the second capping layer and the reflectance of the upper surface of the second capping layer may be 5% or less.

The first thickness may be 250 Å to 500 Å, and the second thickness may be 300 Å to 700 Å.

Light emitted through an upper surface of the organic light emitting layer may be sequentially transmitted by the transmissive electrode, the first capping layer and the second capping layer, and an amount of light transmitted by the second capping layer may be proportional to a value acquired by subtracting reflectance of the transmissive electrode, the reflectance of the interface between the first capping layer and the second capping layer and the reflectance of the upper surface of the second capping layer from the total amount of light emitted through the upper surface of the organic light emitting layer.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention.

FIG. 2 is a cross-sectional view illustrating a transparent display device in accordance with a first embodiment of the present disclosure.

FIG. 6 is a graph representing intensities of blue light emitted through the respective capping structures.

FIGS. 10A to 10C are graphs representing tendencies of transmittances of blue, green, and red light according to application of thicknesses of the respective capping layers of the capping structure of the transparent display device in accordance with embodiments of the present disclosure.

FIGS. 12A and 12B are graphs representing transmittances and spectra of a capping structure formed by stacking a high refractive index capping layer having destructive interference properties and a low refractive index capping layer, another capping structure, and a single high refractive index capping layer having constructive interference characteristics.

DETAILED DESCRIPTION

Figure 1:
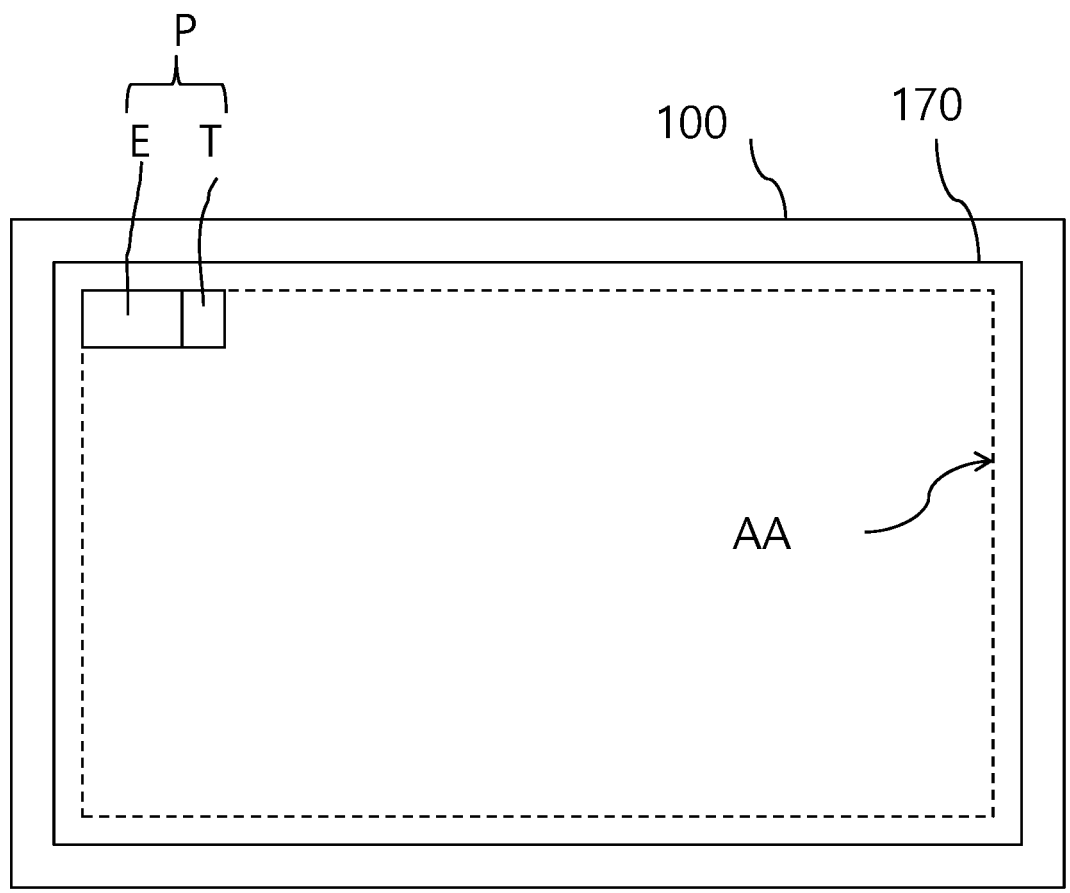
FIG. 1 is a plan view of a transparent display device in accordance with an embodiment of the present disclosure.

Reference will now be made in detail to the preferred embodiments of the present invention, examples of which are illustrated in the accompanying drawings. However, the present invention may be embodied in many alternative forms and should not be construed as limited to the embodiments set forth herein, and the embodiments of the present invention are provided only to completely disclose the invention and to completely inform those skilled in the art of the scope of the invention. Further, the names of elements used in the following description of the embodiments of the present invention are selected in consideration of ease in preparation of the specification, and may thus differ from the names of parts of an actual product.

Shapes, sizes, rates, angles, numbers, etc. disclosed in the drawings to describe the embodiments of the present invention are only exemplary and do not limit the present invention. In the following description of the embodiments and the drawings, the same or similar elements are denoted by the same reference numerals even though they are depicted in different drawings. In the following description of the embodiments of the present invention, a detailed description of known functions and configurations incorporated herein will be omitted when it may make the subject matter of the present invention rather unclear. In the following description of the embodiments, the terms 'including', 'having', 'consisting of', etc. will be interpreted as indicating presence of one or more other characteristics, numbers, steps, operations, elements or parts stated in the specification or combinations thereof, and do not exclude presence of characteristics, numbers, steps, operations, elements, parts or combinations thereof, or possibility of adding the same, unless the term 'only' is used. It will be understood that a singular expression of an element encompasses a plural expression of the element unless stated otherwise.

In interpretation of elements included in the various embodiments of the present invention, it will be interpreted that the elements include error ranges even if there is no clear statement.

In the following description of the embodiments, it will be understood that, when positional relations are expressed, for example, when an element is 'on', 'above', 'under', 'beside', etc. another element, the two elements may directly contact each other, or one or more other elements may be interposed between the two elements unless the term 'just' or 'directly' is used.

In the following description of the embodiments, it will be understood that, when temporal relations are expressed, for example, a term expressing a sequence of events, such as 'after', 'subsequent to', 'next to' or 'before' may encompass continuous relationship between the events, or discontinuous relationship between the events unless the term 'just' or 'directly' is used.

In the following description of the embodiments, it will be understood that, when the terms 'first', 'second', etc. are used to describe various elements, these terms are used merely to discriminate the same or similar elements. Therefore, an element modified by the term 'first' may be the same as an element modified by the term 'second' within the technical scope of the invention unless stated otherwise.

Characteristics of the various embodiments of the present invention may be partially or entirely connected to or combined with each other and technically variously driven and interlocked with each other, and the respective embodiments may be independently implemented or be implemented together in connection with each other.

Figure 3A:
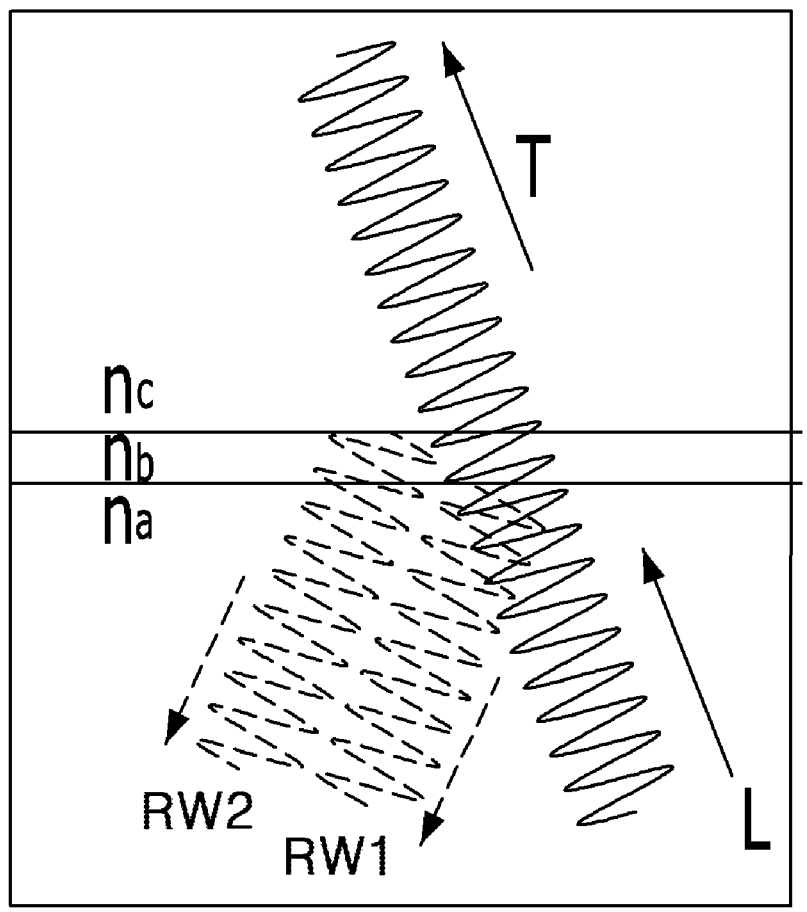
FIGS. 3A and 3B are views illustrating principles of destructive interference and constructive interference, respectively.
Figure 3B:
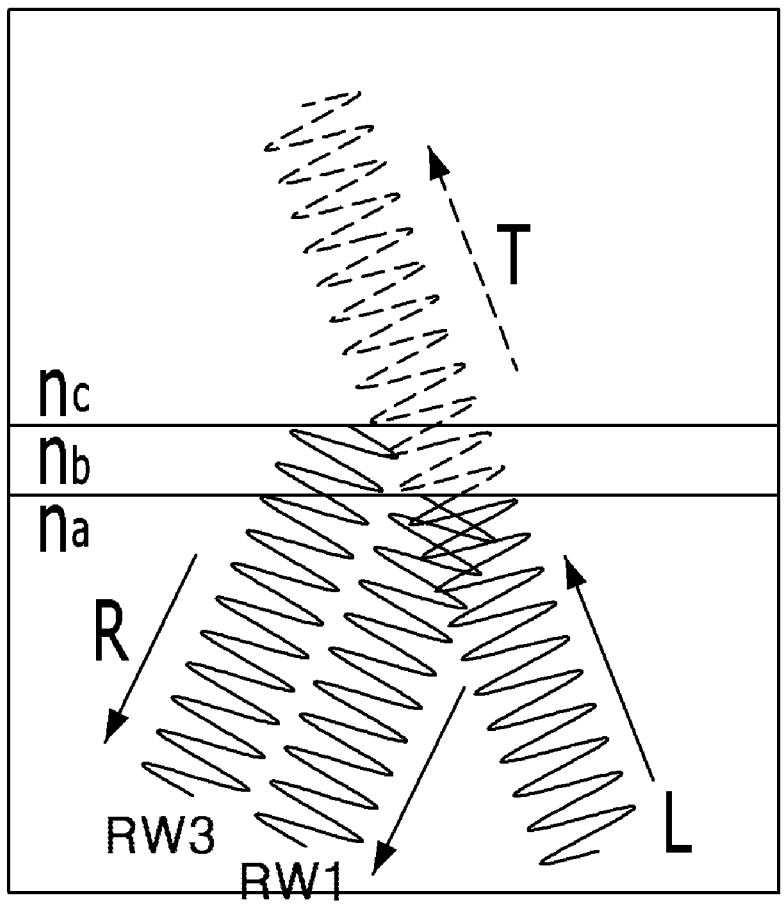

FIG. 1 is a plan view of a transparent display device in accordance with an embodiment of the present disclosure, FIG. 2 is a cross-sectional view illustrating a transparent display device in accordance with a first embodiment of the present disclosure, and FIGS. 3A and 3B are views illustrating principles of destructive interference and constructive interference, respectively.

As shown in FIGS. 1 and 2, in the transparent display device in accordance with the first embodiment of the present disclosure, a pixel including an emission portion E and a transmission portion T shown in FIG. 2 is two-dimensionally repeated in horizontal and vertical lines, in an active area AA of a substrate 100.

The substrate 100 is formed of a transparent material sufficient to transmit light through the rear surface thereof, for example, a glass substrate or a transparent plastic film. Although, if the transparent display device requires flexibility permanently or in use, the substrate 100 is formed of a transparent plastic film, a glass substrate having a small thickness may be employed as the substrate 100.

The emission portion E and the transmission portion T are provided in each pixel. The emission portion E may include a plurality of subpixels, and the respective subpixels may include light emitting layers which emit light of different colors. An arrangement of the subpixels provided in the emission portion E may include, for example, red, green, and blue subpixels, without being limited thereto, and further include a white subpixel in addition to the red, green, and blue subpixels or be replaced with another arrangement including, for example, cyan, magenta, and yellow subpixels, or yet another arrangement including a combination of other colored subpixels. Light emitting diodes in the emission portion E may be organic light emitting diodes OLED or inorganic light emitting diodes according to components of the light emitting layers.

Although a case in which organic light emitting diodes are used will be described below, the emission portion E may include, for example, quantum dot light emitting diodes (QLEDs) by replacing organic light emitting layers with layers including quantum dot light emitting layers.

If the emission portion E includes organic light emitting diodes OLED, the organic light emitting diode OLED includes an organic light emitting layer 132a, 132b, or 132c, a reflective electrode structure 111 provided between a first surface of the organic light emitting layer 132a, 132b, or 132c, i.e., the lower surface of the organic light emitting layer 132a, 132b, or 132c of FIG. 2, and the substrate 100, and a transmissive electrode 140 provided over a second surface of the organic light emitting layer 132a, 132b, or 132c, i.e., the upper surface of the organic light emitting layer 132a, 132b, or 132c of FIG. 2, throughout the pixels over the substrate 100. Further, a hole-injecting and transporting first common layer 131 is provided between the reflective electrode structures 111 and the organic light emitting layers 132a, 132b, and 132c, and electron-transporting and injecting second and third common layers 133 and 134 are provided between the organic light emitting layers 132a, 132b, and 132c and the transmissive electrode 140. As circumstances require, the third common layer 134 may be omitted, and the second common layer 133 may be provided as a single common layer between the organic light emitting layers 132a, 132b, and 132c and the transmissive electrode 140.

The reflective electrode structure 111 may include at least one reflective electrode, and further include a transparent electrode provided over and/or under the reflective electrode as circumstances require. The transparent display device in accordance with the present disclosure includes the reflective electrode structures 111 only in the emission portion E, and the reflective electrode structures 111 function to reflect light emitted downward from the organic light emitting layers 132a, 132b, and 132c and thus to return the light upward.

The reflective electrode structures 111 in the emission portion E are divided from one another, the respective reflective electrode structures 111 may define the subpixels, and at least one thin film transistor TFT1, TFT2, or TFT3 may be provided in each subpixel. The thin film transistors TFT1, TFT2, and TFT3 are respectively connected to the reflective electrode structures 111 in the corresponding subpixels.

The first to third common layers 131, 133, and 134 and the transmissive electrode 140 are successively formed over not only the emission portions E but also the transmission portions T.

A light emitting device includes the elements from the reflective electrode structure 111 to the transmissive electrode 140 in the emission portion E, and particularly, if the organic light emitting layer 132a, 132b, or 132c is used as a light emitting layer, the light emitting device is referred to as an organic light emitting diode OLED. Tests and characteristic comparison which will be described below are based on organic light emitting diodes. However, the transparent display device in accordance with the present disclosure is not limited to the organic light emitting diodes, and may be applied to quantum dot light emitting diodes including quantum dot light emitting layers as light emitting layers.

In the emission portion E of the present disclosure, the thin film transistors TFT1, TFT2, and TFT3 conductively connected to the respective reflective electrode structures 111 are provided, and the organic light emitting diodes OLED formed in the vertical direction and connected to the thin film transistors TFT1, TFT2, and TFT3 are selectively driven by turning the thin film transistors TFT1, TFT2, and TFT3 on and off.

In the transmission portion T in which the rear surface of the substrate 100 may be seen, in order to secure transparency of the transmission portion T, the thin film transistors TFT1, TFT2, and TFT3, the reflective electrodes 111 and the organic light emitting layers 132a, 132b, and 132c provided in the emission portion E are not provided in the transmission portion T. Here, the first to third common layers 131, 133, and 134 provided in common in the emission portion E and the transmission portion T form an organic stack EL having transparency, and light from the substrate 100 is transmitted by the organic stack EL.

In the transparent display device in accordance with the first embodiment of the present disclosure, the transmissive electrode 140 is shared by the emission portion E and the transmission portion T. This means that a single transmissive electrode 140 to which common voltage or ground voltage is applied is formed throughout the active area including a plurality of pixels, in which an image is displayed. If the transmissive electrode 140 is selectively removed from the surface of the transmission portion T, resistance around a region of the transmission portion T from which the transmissive electrode 140 is removed is increased and thus voltage drop of the transmissive electrode 140 may occur. Therefore, the transmissive electrode 140 may be formed in common in the emission portion E and the transmission portion T.

The transmissive electrode 140 is formed of a silver (Ag) alloy, such as MgAg, to exhibit light transmission properties of the transmission portion T and resonance properties of the emission portion E, and may thus have both reflection and transmission properties. Otherwise, the transmissive electrode 140 may be a transparent electrode formed of IZO or ITO. If the transmissive electrode 140 is formed of a metal having both of reflection and transmission properties, the thickness of the transmissive electrode 140 is 100 Å or less so that the transmission portion T has transmittance of a designated value or more due to the characteristics of the transmissive electrode 140 disposed in common.

Further, the transparent display device in accordance with the first embodiment of the present disclosure includes a capping structure 170 including a first capping layer 171 contacting the upper surface of the transmissive electrode 140 and having destructive interference properties and a first refractive index $n_1$ of 2.0 or more, and a second capping layer 172 contacting the upper surface of the first capping layer 171 and having a second refractive index $n_2$ less than the first refractive index $n_1$ by 0.2 or more but less than 1.2.

Here, the first refractive index $n_1$ may be 2.0 to 2.7, and the second refractive index $n_2$ may be 1.3 to 2.0. The first capping payer 171 may have a higher refractive index than the second capping layer 172.

In the transparent display device in accordance with an embodiment of the present disclosure, the capping structure 170 is provided to protect the organic light emitting diodes OLED, assist extraction of light in the emission portion E, and increase transmittance of the transmission portion T. For this purpose, the capping structure 170 is formed by stacking capping layers having different refractive indexes, i.e., the first capping layer 171 having a high refractive index and the second capping layer 172 having a low refractive index, and thus has destructive interference properties similar to anti-reflection properties when light from the organic light emitting diode OLED passes through the capping structure 170 through adjustment of respective optical distances nd of the first and second capping layers 171 and 172. Particularly, the anti-reflection properties means that, on the assumption that an amount L of light transmitted by the substrate 100 and the organic stack EL in the transmission portion T is 1, an amount R of light reflected by the capping structure 170 is almost close to 0 so that an amount 1-R of light finally emitted from the capping structure 170 becomes a value close to 1, and thus there is no loss of light transmitted by the substrate 100 and the organic stack EL and thereby transmittance is increased.

In the same manner as the above-described first to third common layers 131, 133, and 134 and transmissive electrode 140, the capping structure 170 is integrally formed throughout the active area AA. The first to third common layers 131, 133, and 134, the transmissive electrode 140 and the capping structure 170 may be formed such that the respective areas thereof are gradually increased in the upward direction so as to respectively overlay the lower layers thereof. The transmissive electrode 140 may have a protrusion protruding to the outside of the active area AA (an area located inside a dotted line of FIG. 1), and the protrusion may be connected to a wiring layer formed over a thin film transistor array located under the transmissive electrode 140 and thus receive common voltage or a ground signal. In this case, the capping structure 170 may be provided to overlay the entirety of the transmissive electrode 140 and to protrude to a part of the outside of the active area AA.

In the capping structure 170, the first capping layer 171 and the second capping layer 172 may be formed of an organic or inorganic substance or be formed of an organic-inorganic composite. Factors to determine properties of the first capping layer 171 and the second capping layer 172 are refractive indexes of substances forming the first capping layer 171 and the second capping layer 172 and optical distances nd of the first capping layer 171 and the second capping layer 172 determined by the thicknesses of the corresponding layers. A difference between the optical distance of the first capping layer 171 and the optical distance of the second capping layer 172 is within 10% of the optical distance of the first capping layer 171, and thus the first and second capping layers 171 and 172 have destructive interference properties with respect to wavelengths of similar ranges or the same range.

FIGS. 3A and 3B are views illustrating principles of destructive interference and constructive interference, occurring due to transmission and reflection properties of light, when light L passing through a first layer having a refractive index $n_a$ passes through second and third layers having different refractive indexes $n_b$ and $n_c$ from the refractive index $n_a$.

Here, light L meets different interfaces in a traveling direction and generates different reflected waves at the respective interfaces. Destructive interference of FIG. 3A occurs because a reflected wave RW1 generated by light traveling from the first layer (having the first refractive index $n_a$) to the second layer (having the second refractive index $n_b$) and a reflected wave RW2 generated by light traveling from the second layer (having the second refractive index $n_b$) to the third layer (having the third refractive index $n_c$) have opposite phases. Here, if the respective reflected waves RW1 and RW2 have the same amplitude and period, the sum of the two reflected waves RW1 and RW2 becomes 0 (the reflected waves RW1 and RW2 cancel each other out), and, while the light L passes through the first layer (having the first refractive index $n_a$), the second layer (having the second refractive index $n_b$) and the third layer (having the third refractive index $n_c$), the whole amount of light L is transmitted by the first to third layers without any reflection at the respective interfaces in the traveling direction.

On the other hand, constructive interference of FIG. 3B occurs because the reflected wave RW1 generated by light traveling from the first layer (having the first refractive index $n_a$) to the second layer (having the second refractive index $n_b$) and a reflected wave RW3 generated by light traveling from the second layer (having the second refractive index $n_b$) to the third layer (having the third refractive index $n_c$) have an equal phase. Here, if the respective reflected waves RW1 and RW3 have the same amplitude and period, the sum of the two reflected waves RW1 and RW3 has an amplitude corresponding to two times the amplitude of the single reflected wave RW1, and thus an amount of reflection of waves RW1 and RW3 is increased, as compared to the single reflected wave RW1. When the amplitudes and periods of the respective reflected waves RW1 and RW3 at the interface between the first layer and the second layer and the interface between the second layer and the third layer are theoretically equal, light R reflected by the respective interfaces returns to the first layer, and thus there is no light transmitted by the third layer in a light traveling direction.

The capping structure 170 of the present disclosure is located to contact the transmissive electrode 140, and causes destructive interference shown in FIG. 3A, when light from below the capping structure 170 passes through the capping structure 170. Here, the organic light emitting diode OLED corresponds to the first layer (having the first refractive index $n_a$), the capping structure 170 corresponds to the second layer (having the second refractive index $n_b$), and the outside of the capping structure 170 corresponds to the third layer (having the third refractive index $n_c$).

Figure 4:
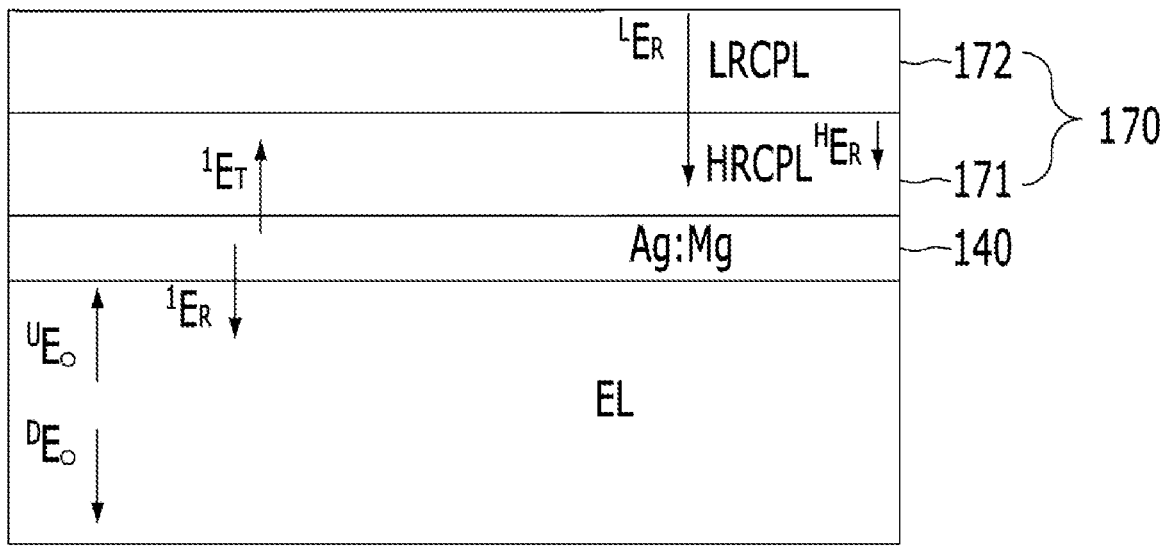
FIG. 4 is a schematic view illustrating transmission and reflection properties at capping layers and interfaces in the transparent display device in accordance with an embodiment of the present disclosure.

FIG. 4 is a schematic view illustrating transmission and reflection properties at the capping layers and interfaces thereof in the transparent display device in accordance with an embodiment of the present disclosure.

FIG. 4 illustrates the transmission portion of the transparent display device in accordance with the present disclosure shown in FIG. 2, and the transmissive electrode 140 and the capping structure 170 are stacked on the organic stack EL in the transmission portion of the transparent display device in accordance with the present disclosure, as shown in FIG. 4. In some cases, an additional layer to have a similar refractive index with the organic stack EL or the capping structure 170 may be further included between the transmissive electrode 140 and the capping structure 170. The organic stack EL includes an organic light emitting layer provided therein, and an upward electromagnetic wave $^U$Eo and a downward electromagnetic wave $^D$Eo are generated through the organic light emitting layer. The upward electromagnetic wave $^U$Eo is divided into an electromagnetic wave $^1E_T$ transmitted upward by the transmissive electrode 140 and an electromagnetic wave $^1E_R$ reflected downward by the transmissive electrode 140, and an electromagnetic wave $^HE_R$ reflected by the interface between the first capping layer 171 and the second capping layer 172 of the capping structure 170 and an electromagnetic wave $^LE_R$ reflected downward by the surface of the second capping layer 172 are generated. Therefore, since transmission of the electromagnetic wave $^1E_T$ transmitted upward by the transmissive electrode 140 is limited by an amount of light reflected downward, the amount of an electromagnetic wave finally transmitted by the capping structure 170 corresponds to $^1E_T - (^LE_R + ^HE_R)$.

That is, the first capping layer 171 has a first thickness $d_1$ and a first refractive index $n_1$, and a first optical distance $n_1 d_1$ of the first capping layer 171 has a value of $m\lambda/2 \cos\theta$ (m being an integral, $\lambda$ being a destructively interfered wavelength and $\theta$ being an angle of incidence) by a condition equation of destructive interference.

Further, the second capping layer 172 located over the first capping layer 171 of the capping structure 170 has a second thickness $d_2$ and a second refractive index $n_2$, and a second optical distance $n_2 d_2$ of the second capping layer 172 is the same as the first optical distance $n_1 d_1$ of the first capping layer 171 or is 0.9 to 1.1 times the first optical distance $n_1 d_1$ of the first capping layer 171 so that a difference therebetween is within 10%. Therefore, the second capping layer 172 has an optical distance which is the same as or similar to the first capping layer 171, and satisfies the condition of destructive interference in the same manner as the first capping layer 171 or in a similar manner to the first capping layer 171.

Here, according to the condition equation of destructive interference, the first optical distance $n_1 d_1$ of the first capping layer 171 and the second optical distance $n_2 d_2$ of the second capping layer 172 respectively have a value of $m\lambda/2$ cos θ (m being an integral, A being a destructively interfered wavelength and θ being an angle of incidence) or a value of 0.9 to 1.1 times m λ/2 cos θ. Here, a primarily destructively interfered wavelength A is a short wavelength in the visible wavelength range, i.e., a blue wavelength. By varying the value of m in the condition equation of destructive interference "2nd cos θ=mλ", in addition to the blue wavelength range, a green, or red wavelength range may satisfy the condition equation of destructive interference.

In the present disclosure, the reason why the primarily destructively interfered wavelength A is the blue wavelength is to compensate for uniformity in transmittance in the blue wavelength which is worst in a single capping layer structure. A peak wavelength of the destructively interfered wavelength may be in the range of about 430 nm to 465 nm.

In the present disclosure, the capping structure 170 has destructive interference properties and thereby reflected waves of the respective interfaces cancel each other out to increase an amount of transmission of finally emitted light and thus to improve transmittance, and is implemented as a stack structure of the high refractive index first capping layer 171 and the low refractive index second capping layer 172 so as to acquire uniform transmission properties according to color regardless of wavelength change in the visible wavelength range.

Figure 5:
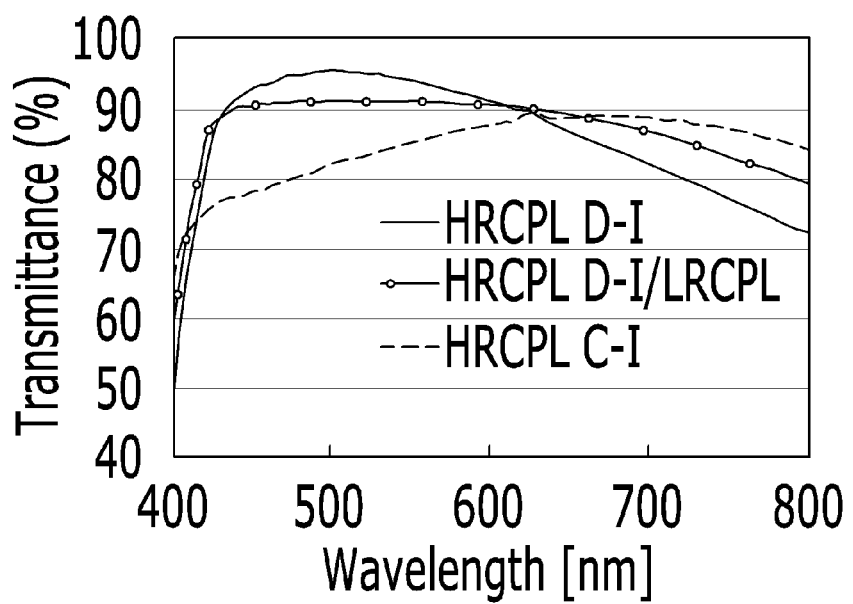
FIG. 5 is a graph representing transmittances of various capping structures.

FIG. 5 is a graph representing transmittances of various capping structures, and FIG. 6 is a graph representing intensities of blue light emitted through the respective capping structures.

As shown in FIG. 5, when a single capping layer HRCPL C-I having a high refractive index (HR) and constructive interference (C-I) properties is used, transmittance tends to be increased in a direction from a short wavelength to a long wavelength in the visible wavelength range of 400 nm to 650 nm.

Further, when a single capping layer HRCPL D-I having a high refractive index (HR) and destructive interference (D-I) properties is used, transmittance tends to be increased by 45% or more in a wavelength range from 400 nm to 520 nm and then to be decreased in a wavelength range from 520 nm to a long wavelength.

Differently, when a stack structure including the high refractive index first capping layer 171 having destructive interference (D-I) properties and the low refractive index second capping layer 172, i.e., the capping structure 170 of the transparent display device in accordance with the present disclosure is used, transmittance tends to be uniformly maintained at 90% or more at least in the visible wavelength range of 400 nm to 650 nm. That is, the transparent display device in accordance with the present disclosure has a primary effect of improving transmittance by a principle of increasing an amount of emitted light by controlling refractive index profiling at the interface between the high refractive index capping layer 171 and the low refractive index capping layer 172, and the interface between the high refractive index capping layer 171 and the organic light emitting diode OLED, as in the effect of destructive interference of FIG. 3A. Further, the transparent display device in accordance with the present disclosure has a secondary effect of maintaining uniform transmittance according to wavelength, particularly in the visible wavelength range, by preventing change in transmittance according to wavelength, which is issued when destructive interference or constructive interference is separately applied, through the double-layered capping structure 170.

That is, in the single capping layers HRCPL D-I and HRCPL C-I in accordance with the experimental examples, transmittance is increased or decreased as the wavelength increases, but, in the capping structure 170 of the transparent display device in accordance with the present disclosure, transmittance is uniformly maintained regardless of wavelength in the visible wavelength range. If the single capping layer is used, transmittance is increased or decreased in the visible wavelength range. If the single capping layer HRCPL C-I having constructive interference properties is used, transmittance tends to be increased in a longer wavelength range rather than the visible wavelength range and thus transmittance in the visible wavelength range is comparatively low. Further, if the single capping layer HRCPL D-I having destructive interference properties is used, the transmittance in the visible wavelength range is high but an amount of transmission of light in the visible wavelength range is increased and decreased and, thus, when the single capping layer HRCPL D-I is applied to a light emitting display device, luminance in the green wavelength range is relatively high and thus serves as a factor hindering user visibility. The transparent display device in accordance with the present disclosure reduces optical distances of two interfaces and an optical distance difference, and thus allows transmittance to be uniform in a direction from a short wavelength to a long wavelength in the visible wavelength range of 450 nm to 650 nm, thereby achieving stable display without a luminance difference of a specific color in the visible wavelength range.

Referring to FIG. 6, it may be confirmed that, when the single high refractive index capping layer HRCPL D-I having destructive interference properties is used, the intensity of a peak wavelength is about 0.21, which is lower than the intensity of a peak wavelength, i.e., 0.26, when the single high refractive index capping layer HRCPL C-I having constructive interference properties is used. This means that, when the single high refractive index capping layer HRCPL D-I having destructive interference properties is used, transmission properties are improved in all wavelength ranges but the microcavity effect in the organic light emitting device is reduced, i.e., weak cavity characteristics are represented, and efficiency of pure blue is lowered. Further, it may be understood that, when the single high refractive index capping layer HRCPL D-I having destructive interference properties is used, a shoulder of the spectrum occurs at a wavelength of about 490 nm, concentration of the peak wavelength is lowered, and thus color purity is lowered.

On the other hand, it may be confirmed that, when the single high refractive index capping layer HRCPL C-I having constructive interference properties is used or the double-layered capping structure 170 including the first and second capping layer 171 and 172 in accordance with the present disclosure is used, the peak wavelength occurs at about 450 nm to 460 nm, the intensity of the peak wavelength is about 0.235 or more so that an amount of light reflected by the interface between the capping layers 171 and 172 is decreased and thus an amount of emitted light is increased, and no shoulder occurs at other wavelengths in the spectrum when blue light is emitted and thus color purity is high.

Referring to FIG. 6, when the single high refractive index capping layer HRCPL C-I having constructive interference properties is used, color purity is excellent, but, as described above (with reference to FIG. 5), transmittance of the single high refractive index capping layer HRCPL C-I having constructive interference properties is less than 90% throughout the visible wavelength range, a deviation in transmittance in the visible wavelength range is great and thus uniformity in color efficiency according to wavelength may not be secured.

That is, if a single capping layer, i.e., the single high refractive index capping layer HRCPL C-I having constructive interference properties or the single high refractive index capping layer HRCPL D-I having destructive interference properties, is used, a deviation in transmittance in the visible wavelength range is great, and thus, even if the transparent display device is implemented to emit white light, the white light is observed as light of a color having relatively high transmittance. The capping structure 170 in accordance with the present disclosure, in which the high refractive index first capping layer 171 and the low refractive index second capping layer 172 have destructive interference properties, allows transmittance to be uniform throughout the visible wavelength range and thus solves the above-described problem caused by the single capping layer.

Hereinafter, structures of transparent display devices in accordance with various experimental examples and test results thereof will be described, as compared to the transparent display device in accordance with the present disclosure.

Figure 7A:
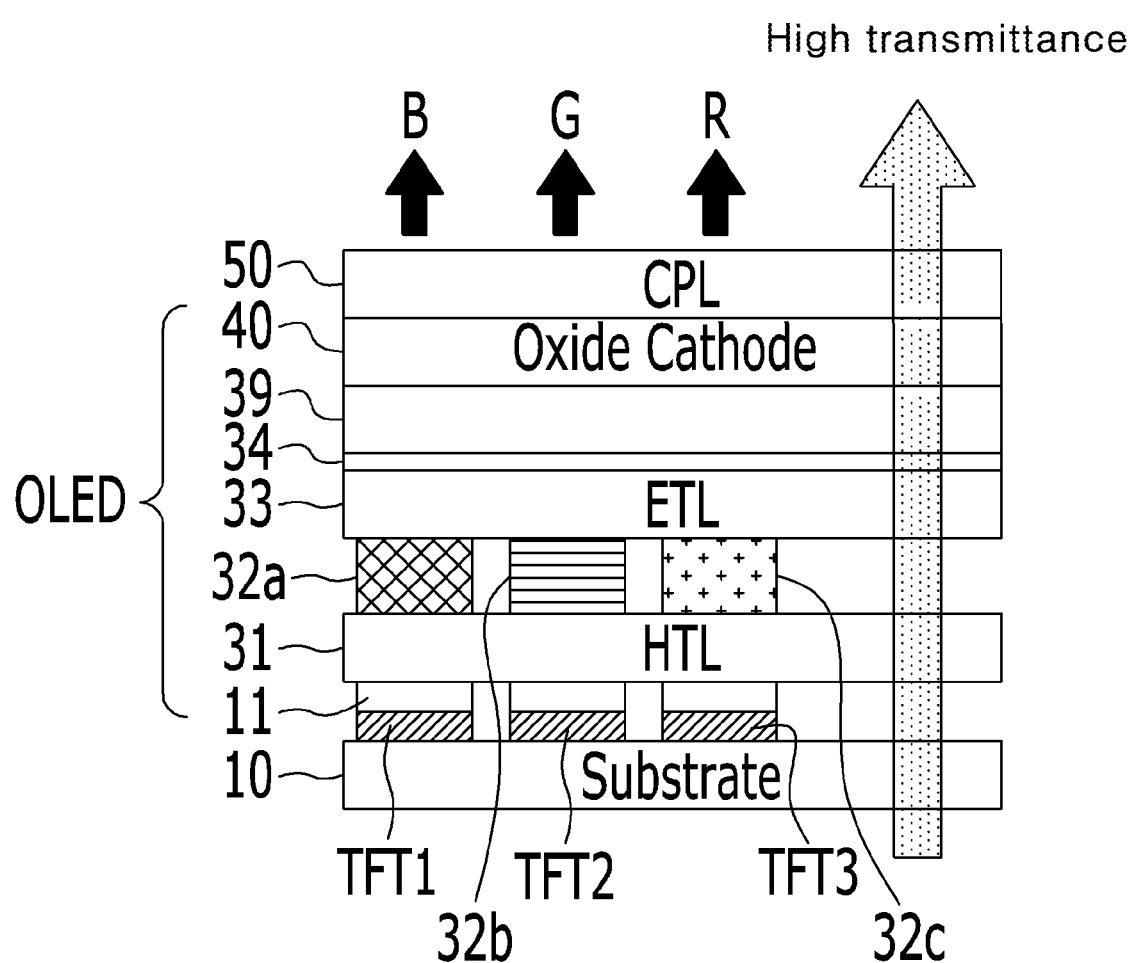
FIGS. 7A to 7C are cross-sectional views illustrating transparent display devices in accordance with various experimental examples according to disposition of a second electrode located in a light emitting direction and a capping structure according to embodiments of the present disclosure.
Figure 7B:
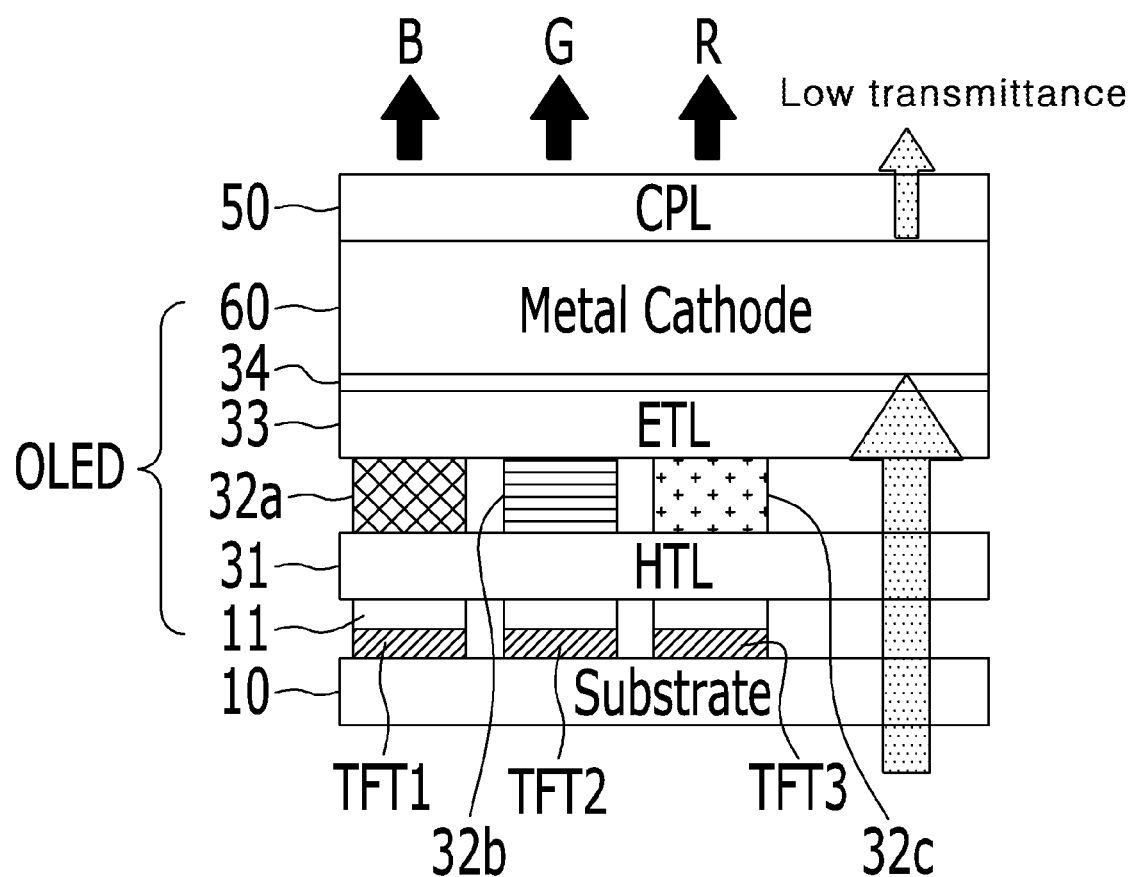
Figure 7C:
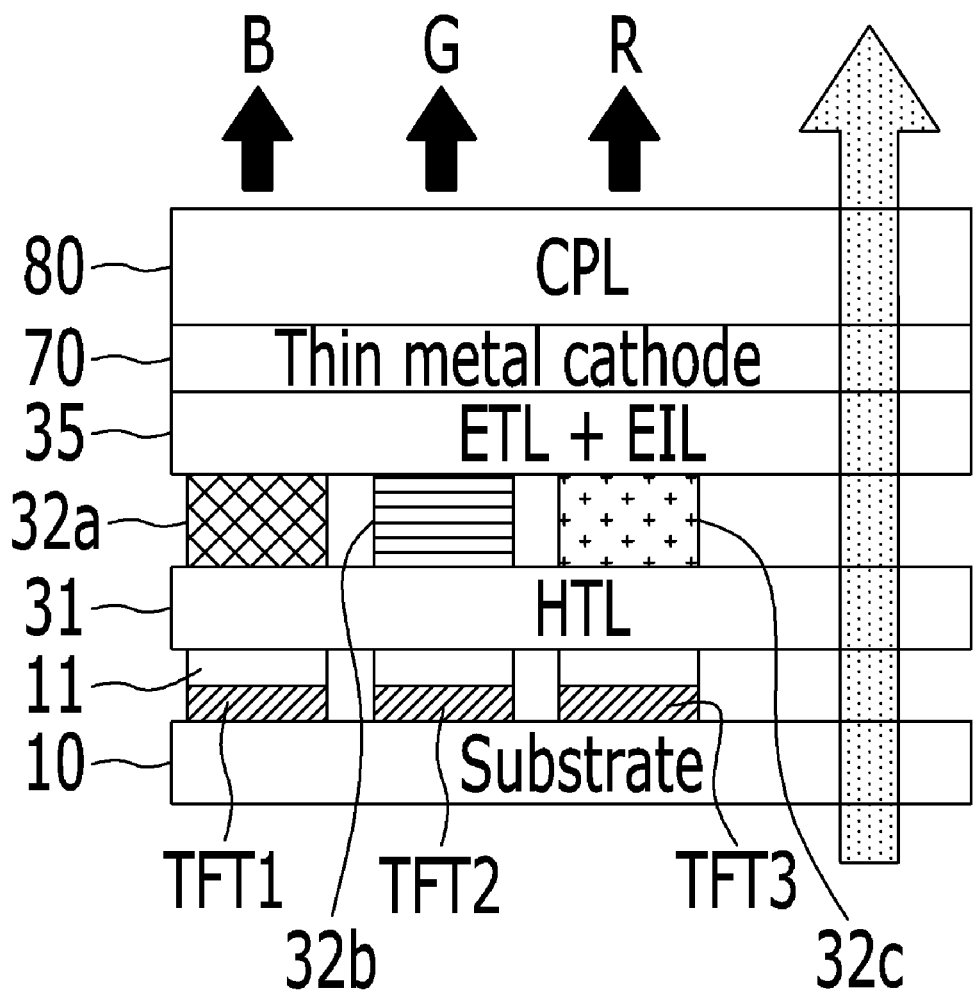
Figure 8:
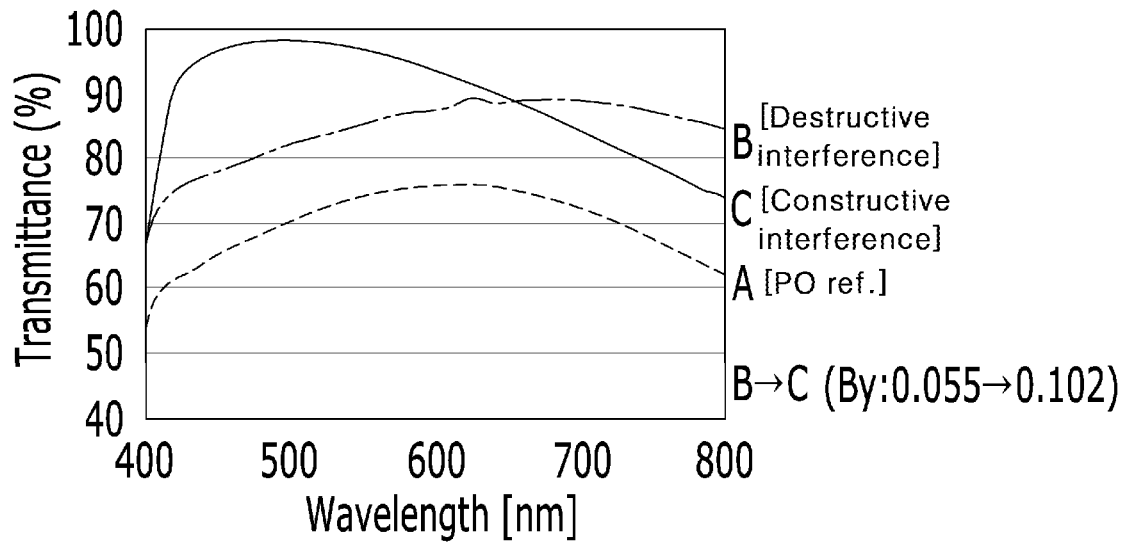
FIG. 8 is a graph representing transmittances of the transparent display devices of FIGS. 7A to 7C according to embodiments of the present disclosure.

FIGS. 7A to 7C are cross-sectional views illustrating transparent display devices in accordance with various experimental examples according to disposition of a second electrode located in a light emitting direction and a capping structure, and FIG. 8 is a graph representing transmittances of the transparent display devices of FIGS. 7A to 7C.

As shown in FIG. 7A, a transparent display device A [PO ref.] (in FIG. 8) in accordance with a first experimental example includes subpixels configured to emit light of different colors and a transmission portion in each pixel over a substrate 10, thin film transistors TFT1, TFT2, and TFT3 provided in the respective subpixels, and organic light emitting diodes OLED connected to the thin film transistors TFT1, TFT2, and TFT3. The organic light emitting diode OLED includes a first electrode 11 and a second electrode 40 disposed opposite to each other, and a plurality of organic layers 31, 32a/32b/32c, 33, and 34 provided between the first and second electrodes 11 and 40. In the first experimental example, the second electrode 40 is a transparent electrode formed of a transparent oxide, such as ITO or IZO, interface matching with an organic layer directly contacting the second electrode 40 is poor, and thus a buffer layer 39 is further provided. As organic layers, a hole-transporting first common layer 31, an organic light emitting layer 32a, 32b or 32c, an electron-transporting second common layer 33 and an electron-injecting third common layer 34 are sequentially provided. The first to third common layers 31, 33, and 34 and the second electrode 40 are provided in common in the emission portions and the transmission portions, and a capping layer 50 provided over the organic light emitting diodes OLED is provided as a single capping layer having destructive interference properties.

The transparent display device in accordance with the first experimental example is one example of a transparent display device in an initial stage and, in a structure having both emission portions and transmission portions, transmission properties of the transmission portions are further emphasized and, for this purpose, the second electrode 40 is provided as the transparent electrode. Here, since the microcavity effect at red, green, and blue wavelengths in the organic light emitting diode OLED is lowered (weak cavity characteristics), the emission portion has transmittance of less than 75% in the visible wavelength range, as shown in FIG. 8, and color efficiency in the emission portion is poor regardless of interference properties of the single capping layer 50.

As shown in FIG. 7B, a transparent display device B [CPL destructive interference] (in FIG. 8) in accordance with a second experimental example differs from the transparent display device A [PO ref.] in accordance with the first experimental example in that a second electrode 60 is formed of a metal or a metal alloy having excellent interface matching with a third common layer 34, and a buffer layer is omitted so that the third common layer 34 and the second electrode 60 directly contact each other. In this case, the second electrode 60 formed of a metal component has a thickness of 140 Å or more so as to exhibit sufficient microcavity effect in an emission portion. Here, a capping layer 50 located over the second electrode 60 is provided as a single capping layer having destructive interference properties so as to increase the light extraction effect. In this case, in the transparent display device in accordance with the second experimental example, transmittances of red light, green light, and blue light are improved on the whole due to increase in efficiency of the emission portion, but fluctuation of transmittance according wavelength change is caused. Further, since the second electrode 60 formed of a transflective metal has a thickness of 140 Å or more, transmittance of a transmission portion is lowered.

In order to improve transmittance of the transmission portion of the transparent display device in accordance with the second experimental example, a transparent display device including a second electrode 70 having a reduced thickness in accordance with a third experimental example is proposed. FIG. 7C illustrates the transparent display device C [CPL constructive interference] (in FIG. 8) in accordance with the third experimental example, and, in this case, a capping layer 80 located over the second electrode 70 is provided as a single capping layer having constructive interference properties so as to raise transmittance. In the transparent display device in accordance with the third experimental example, the second electrode 70 is formed of a metal or a metal alloy and has a thickness of 100 Å or less, and transmittance is increased in the visible wavelength range, due to the capping layer 80 having constructive interference properties located over the second electrode 70, but is greatly changed by about 30%, particularly in the blue wavelength range of 400 nm to 490 nm, and transmittance is not uniform in other wavelength ranges and is decreased again in the wavelength range of about 490 nm to 510 nm or more, as shown in FIG. 8. That is, the transparent display device in accordance with the third experimental example acquires transmittance of a designated degree or more through the second electrode 70 having a small thickness, but exhibits non-uniform transmittance in the visible wavelength range and thus have different color efficiencies of blue, green, and red, thereby causing a difficulty in uniform and stable color expression.

Particularly, when the transparent display devices in accordance with the second and third experimental examples are compared, it was observed that, as a result of measurement of a CIEy value of color coordinates, the CIEy value is changed from 0.055 to 0.102. This means that color distortion of blue in the transparent display device in accordance with the third experimental example is severe and thus it is difficult to express pure blue.

Figure 9:
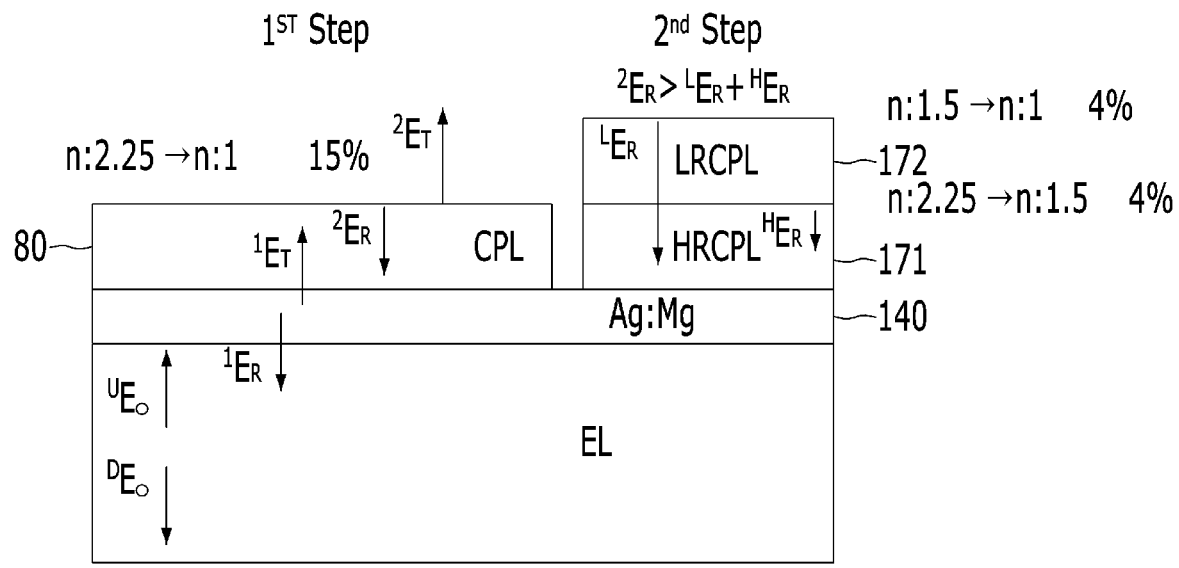
FIG. 9 is a schematic cross-sectional view illustrating transmission and reflection properties of capping layers and interfaces in the transparent display device in accordance with a third experimental example and the transparent display device in accordance with the present disclosure.

FIG. 9 is a schematic cross-sectional view illustrating transmission and reflection properties of the capping layers and the interfaces thereof in the transparent display device in accordance with the third experimental example and the transparent display device in accordance with an embodiment of the present disclosure.

In FIG. 9, reference mark "1st step" represents transmission and refection properties of the respective layers of the transparent display device in accordance with the third experimental example, and reference mark "2nd step" represents transmission and refection properties of the respective layers of the transparent display device in accordance with an embodiment of the present disclosure.

In the third experimental example and the present disclosure, the second electrode and a semi-transmissive electrode 140 are formed of a semi-transmissive metal, i.e., a silver alloy, such as Ag:Mg. The thicknesses of the second electrode and the semi-transmissive electrode 140 are 100 Å or less, and are 50 Å or more so as to prevent resistance increase in the whole areas thereof. This serves to raise transmittance in the transmission portion.

In order to represent transmission and reflection properties, transmittances of light emitted upward are compared, when the second electrode and the semi-transmissive electrode 140 having the same thickness are applied to the transparent display device in accordance with the third experimental example and the transparent display device in accordance with the present disclosure.

In the transparent display device in accordance with the third experimental example, the second electrode 140 (70 in FIG. 7C) and the single high refractive index capping layer 80 are sequentially stacked over the organic stack EL. The organic stack EL includes an organic light emitting layer provided therein, and an upward electromagnetic wave $^{U}Eo$ and a downward electromagnetic wave $^{D}Eo$ are generated through the organic light emitting layer. An electromagnetic wave $^{1}E_{T}$ and an electromagnetic wave $^{1}E_{R}$ respectively transmitted upward and reflected downward by the second electrode 140 are generated from the upward electromagnetic wave $^{U}Eo$, and an electromagnetic wave $^{2}E_{T}$ and an electromagnetic wave $^{2}E_{R}$ respectively transmitted upward and reflected downward by the upper surface of the capping layer 80 are generated.

In the transparent display device in accordance with the present disclosure, as described above referring to FIG. 4, the organic stack EL includes an organic light emitting layer provided therein, an upward electromagnetic wave $^{U}Eo$ and a downward electromagnetic wave $^{D}Eo$ are generated through the organic light emitting layer, an electromagnetic wave $^{1}E_{T}$ and an electromagnetic wave $^{1}E_{R}$ respectively transmitted upward and reflected downward by the second electrode 140 are generated from the upward electromagnetic wave $^{U}Eo$, and an electromagnetic wave $^{H}E_{R}$ reflected by the interface between the first capping layer 171 and the second capping layer 172 of the capping structure 170 and an electromagnetic wave $^{L}E_{R}$ reflected downward by the surface of the second capping layer 172 are generated.

Here, on the assumption that the total amount of the electromagnetic wave $^{1}E_{T}$ transmitted upward by the second electrode (or transmissive electrode) 140, which is provided in common in the transparent display devices in accordance with the third experimental example and the present disclosure, is 1, a value acquired by subtracting reflectance (an amount of the electromagnetic wave reflected by the capping layer 80 or the capping structure 170 located thereon) from the total amount of the electromagnetic wave $^{1}E_{T}$ is an amount of light actually transmitted upward by the capping layer 80 or the capping structure 170.

Reflectance of the transparent display device in accordance with the third experimental example corresponds to the electromagnetic wave $^{2}E_{R}$ reflected downward by the upper surface of the single capping layer 80, i.e., monoreflection occurs. Reflectance of the transparent display device in accordance with the present disclosure corresponds to reflectance of the capping structure 170 including the first and second capping layers 171 and 172 provided over the second electrode 140, i.e., the sum of the electromagnetic wave $^{L}E_{R}$ reflected downward by the surface of the second capping layer 172 and the electromagnetic wave $^{H}E_{R}$ reflected by the interface between the first and second capping layers 171 and 172 ($^{L}E_{R}+^{H}E_{R}$).

For example, on the assumption that the first refractive index of the first capping layer 171 and the single high refractive index capping layer 80 is 2.25, the second refractive index of the second capping layer 172 is 1.5 and a structure located over the capping layer 80 and the capping structure 170 is air, reflectances of the transparent display devices in accordance with the third experimental example and the present disclosure will be compared below.

For reference, reflectance of the interface between two layers having different refractive indexes $n_1$ and $n_2$ corresponds to $$\left(\frac{n_1\cos\theta_i - n_2\cos\theta_t}{n_1\cos\theta_i + n_2\cos\theta_t}\right)^2$$

($\theta_i$ being an angle of incidence and $\theta_t$ being an angle of exit).

In consideration of an angle of incidence and an angle of exit of the respective layers in the normal direction at which visibility at the front is most effective, the angle of incidence e and the angle of exit $\theta_t$ may be 0°.

In the transparent display device in accordance with the third experimental example, since only monoreflection ($^{2}E_{R}$) by the upper surface of the single capping layer 80 is considered, when the refractive index of the capping layer 80, i.e., 2.25, and the refractive index of air, i.e., 1, are substituted into the above equation, reflectance of about 15% is calculated.

In the transparent display device in accordance with the present disclosure, reflectance of the interface between the first and second capping layers 171 and 172 through reflection ($^{H}E_{R}$) is calculated as 4% because the refractive indexes of the first and second capping layers 171 and 172 are 2.25 and 1.5, and reflectance of the upper surface of the second capping layer 172 through reflection ($^{L}E_{R}$) by the upper surface of the second capping layer 172 is calculated as 4% on the assumption that air is located over the second capping layer 172 because the refractive index of air is 1. That is, even if there are two interfaces, a difference between the reflectance of the two interfaces becomes 0%. As another example, when the refractive index of the first capping layer 171 is 2.0, the refractive index of the second capping layer 172 is 1.5, and air is located over the second capping layer 172, the interface between the first and second capping layers 171 and 172 has reflectance of about 2.8% and the interface between the second capping layer 172 and air has reflectance of 4% and thus a difference therebetween becomes within 2%.

That is, in the transparent display device in accordance with the present disclosure, a plurality of interfaces at which reflection occurs in the traveling direction of light are formed by the capping structure 170, a refractive index difference between two layers forming each of the interfaces is reduced and thus reflectance may be greatly reduced in proportion to the square of the refractive index difference, and an amount of light reflected downward by the upper surface of the capping structure 170 is reduced ($^2E_R$>($^LE_R$+ $^HE_R$)), as compared to the transparent display device having high transmittance in accordance with the third experimental example, and thus transmittance may be raised due to the anti-reflection effect.

Although the above-described example illustrates that there is air outside the capping layer 80 and the capping structure 170, in the transparent display device in accordance with the present disclosure, the case that an encapsulation layer (Refer 300 FIG. 15) of a filling material and a structure corresponding an upper substrate are located over the capping structure 170 may be considered.

Here, on the assumption that the refractive index of the encapsulation layer of the filling material located over the capping structure 170 is $n_{Encap}$, reflectance of the upper surface of the second capping layer 172 corresponds to $$\left(\frac{n_2\cos\theta_i - n_{Encap}\cos\theta_t}{n_2\cos\theta_i + n_{Encap}\cos\theta_t}\right)^2$$

($n_{Encap}$ being a refractive index of an element located over the second capping layer, $\theta_i$ being an angle of incidence and $\theta_t$ being an angle of exit).

Reflectance of the interface between the first capping layer 171 and the second capping layer 172 is $$\left(\frac{n_1\cos\theta_i - n_2\cos\theta_t}{n_1\cos\theta_i + n_2\cos\theta_t}\right)^2$$

($\theta_i$ being an angle of incidence and $\theta_t$ being an angle of exit), and a difference between reflectance of the interface between the first and second capping layers 171 and 172 and reflectance of the upper surface of the second capping layer 172 is set to 5% or less so that the transparent display device in accordance with the present disclosure has the transmittance rising effect. Since, if reflectance of one interface in the light emitting direction is superior to reflectance of the other surface, it is difficult for the capping structure formed by stacking the high refractive index capping layer 171 and the low refractive index capping layer 172 shown in FIG. 5 to acquire uniform transmission properties according to wavelength, the reflectance difference between the two interfaces is minimized or reduced.

In the transparent display device in accordance with the present disclosure, since the capping structure 170 must have destructive interference properties in order to achieve transmittance, the first thickness may be 300 Å to 500 Å, and the second thickness may be 300 Å to 700 Å.

The first capping layer 171 and the second capping layer 172 follow the condition equation of destructive interference "2nd cos θ=mλ", and thereby, the optical distances of the respective layers 171 and 172 are equal or have a difference of within 10%. Here, in the condition equation of destructive interference, a destructively interfered wavelength λ is a blue wavelength of about 430 nm to 465 nm so as to maintain high transmittance. In consideration of visibility at the front, θ may be 0°.

Since the second capping layer 172 has a relatively low refractive index $n_2$ ($n_2<n_1$), in order to set an optical distance difference ($n_1d_1-n_2d_2$) with the first capping layer 171 having a relatively high refractive index $n_1$ to be within 10% of the optical distance $n_1d_1$ of the first capping layer 171, the second thickness $d_2$ of the second capping layer 172 may be greater than the first thickness $d_1$ of the first capping layer 171.

Since the encapsulation layer located over the capping structure 170 includes a plurality of layers so as to exhibit an encapsulating function and has a thickness of 1 μm or more, light transmitted from below may be transmitted by the encapsulation layer without reflection at the interface with the capping structure 170 regardless of a refractive index difference with the capping structure 170.

The encapsulation layer may have a structure in which an inorganic film which may be deposited at a low temperature, such as $SiN_x$, $SiON_y$, $SiO_x$, silicon oxycarbide (SiOC) or $Al_2O_3$, and an organic film formed of a non-photosensitive organic insulating material, such as PCL, acrylic resin, epoxy resin, or polyimide, polyethylene, or a photosensitive organic insulating material, such as photoacyl, are alternately stacked. The filling material may include a resin, such as epoxy resin, acrylic resin, polyimide or polyethylene, and further include a moisture absorbent in addition to the resin.

Hereinafter, the reasons for use of the double-layered capping structure 170 in the present disclosure will be described.

In the transparent display device in accordance with the present disclosure, destructive interference properties of the capping structure 170 depend on the first capping layer 171 closest to the transmissive electrode 140, and particularly, the first capping layer 171 has a high refractive index of 2.0 or more and a very small thickness of 300 Å to 500 Å. In case of a material having a small thickness and a high refractive index, an intensity of blue light is low and transmittance tends to be decreased as wavelength is increased in the visible wavelength range, as shown in the corresponding curves representing destructive interference (D-I) properties in FIGS. 5 and 6. Therefore, in the transparent display device in accordance with the present disclosure, the second capping layer 172 having a lower refractive index than the first capping layer 171 is stacked over the first capping layer 171 so as to uniformly maintain transmission properties in the visible wavelength range regardless of wavelength. Since, among materials having low refractive indexes, a material, transmittance of which is scarcely changed according to wavelength, may be used, the material may satisfy the optimum condition to achieve uniform transmittance according to wavelength. Further, since interface reflection is decreased as wavelength is increased, transmittance in a long wavelength range may be increased.

Figure 10A:
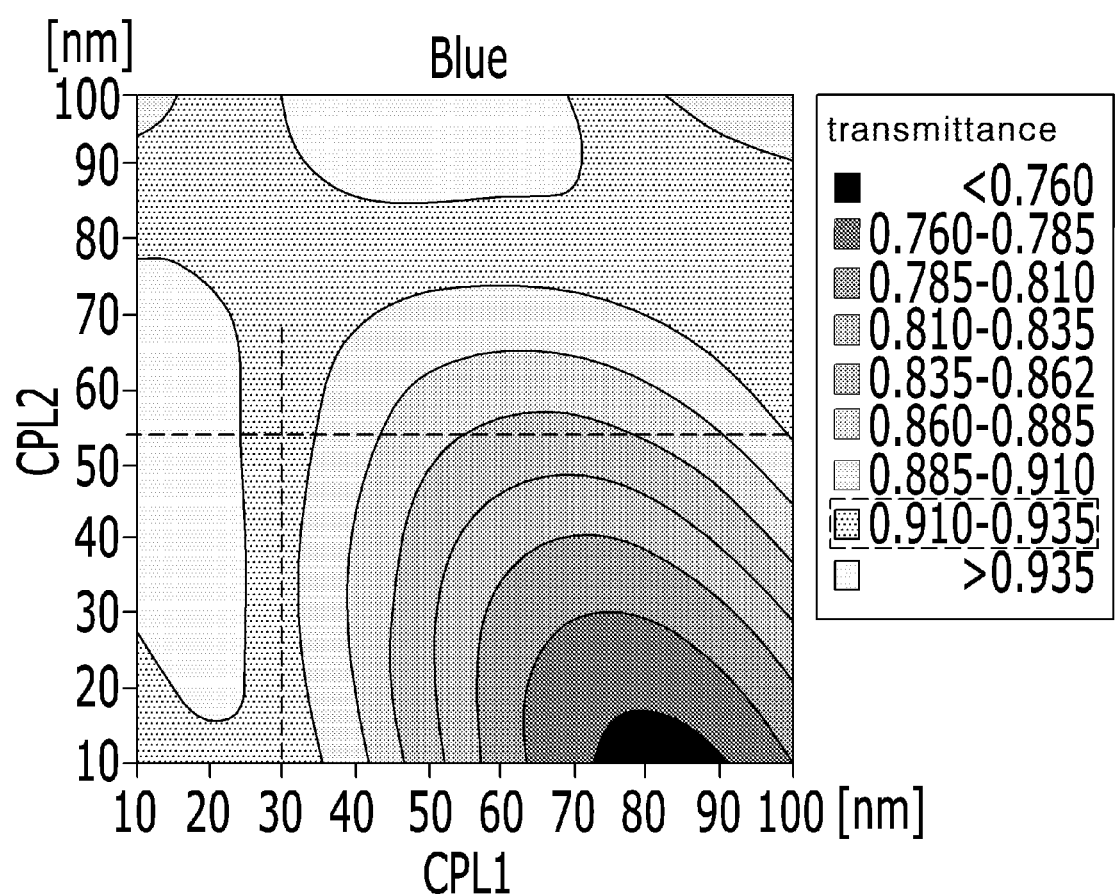
Figure 10C:
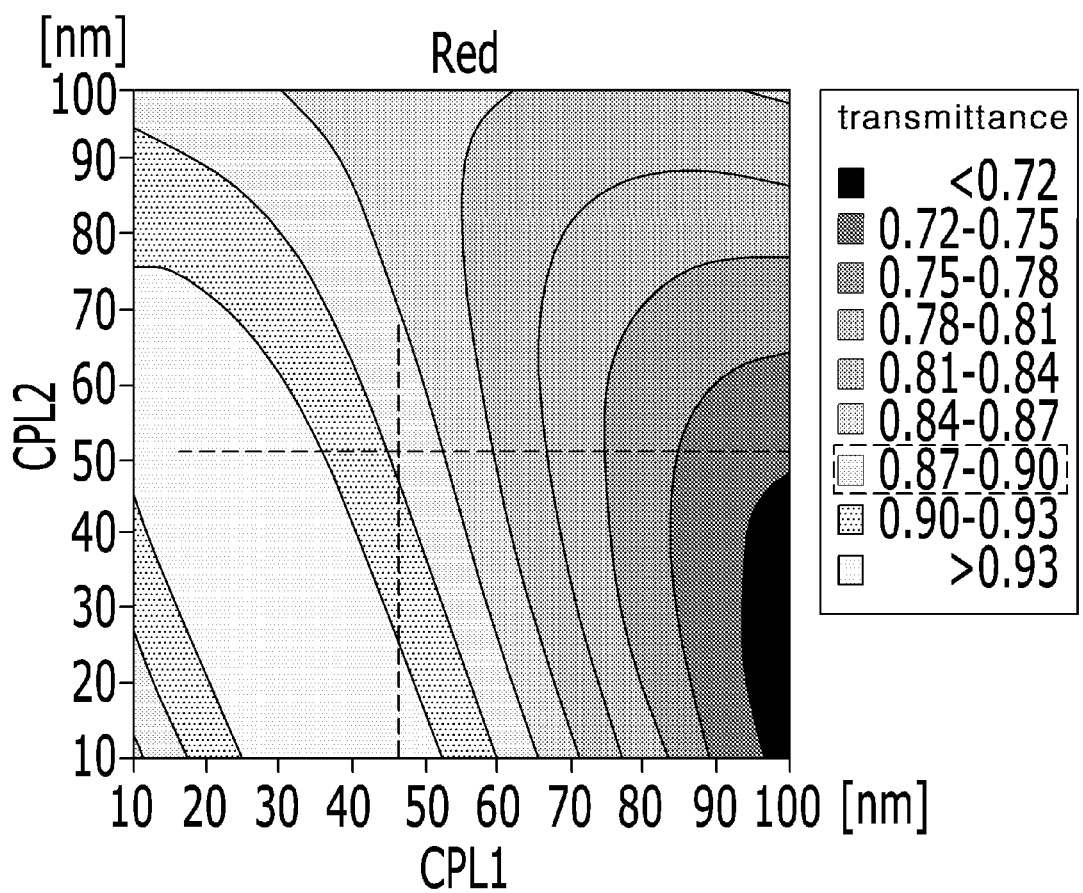

FIGS. 10A to 10C are graphs representing tendencies of transmittances of blue light, green light, and red light according to application of thicknesses of the respective capping layers of the capping structure of the transparent display device in accordance with the present disclosure.

In the transparent display device in accordance with the present disclosure, in order to allow the first and second capping layers 171 and 172 to have the same or similar destructive interference properties, the optical distance of the second capping layer 172 is 0.9 to 1.1 times the optical distance of the first capping layer 171. In the capping structure 170 having the same thickness throughout the active area AA, as results of measurement of transmittances of blue light, green light, and red light according to change in the thicknesses of the first capping layer 171 and the second capping layer 172, it may be confirmed that, when the thickness of the first capping layer 171 is about 250 Å (25 nm) to 500 Å (50 nm) and the thickness of the second capping layer 172 is about 300 Å (30 nm) to 700 Å (70 nm), the capping structure 170 exhibits blue light transmittance of 0.860, green light transmittance of 0.86 or more, and red light transmittance of 0.87 or more, and thus exhibits in common high transmittances of 0.86 or more with respect to different wavelengths. That is, it may be confirmed that, if the capping structure 170 including the first and second capping layers 171 and 172 having different refractive indexes in accordance with the present disclosure is used to have destructive interference properties, the capping structure 170 exhibits uniformly high transmittances with respect to wavelengths in the visible wavelength range if the first and second capping layers 171 and 172 are within the above-described thickness ranges.

Figure 11A:
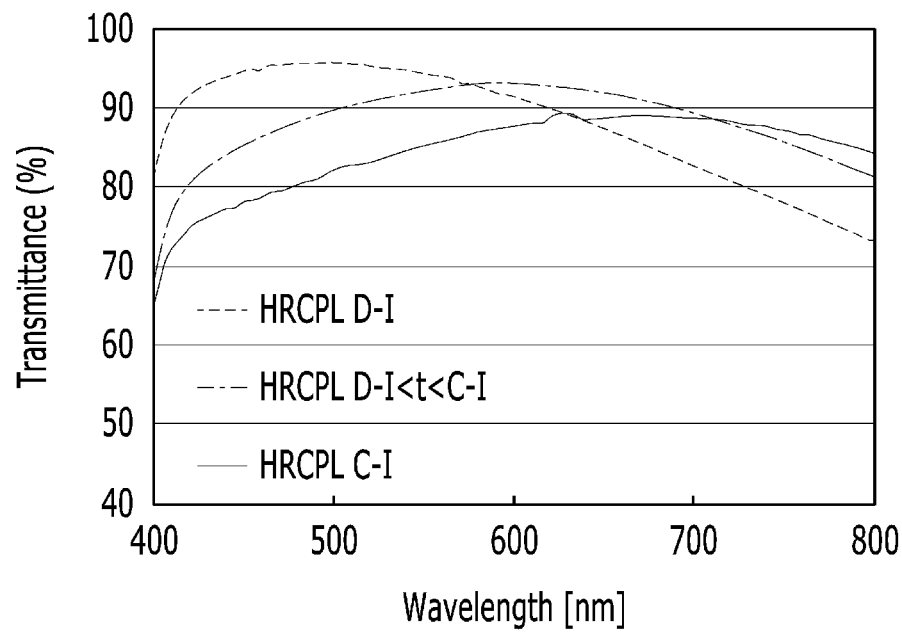
FIGS. 11A and 11B are graphs representing transmittances and spectra in test examples in which a high refractive index capping layer is used as a single capping layer but the high refractive index capping layer is adjusted to have different destructive interference properties and constructive interference properties.
Figure 11B:
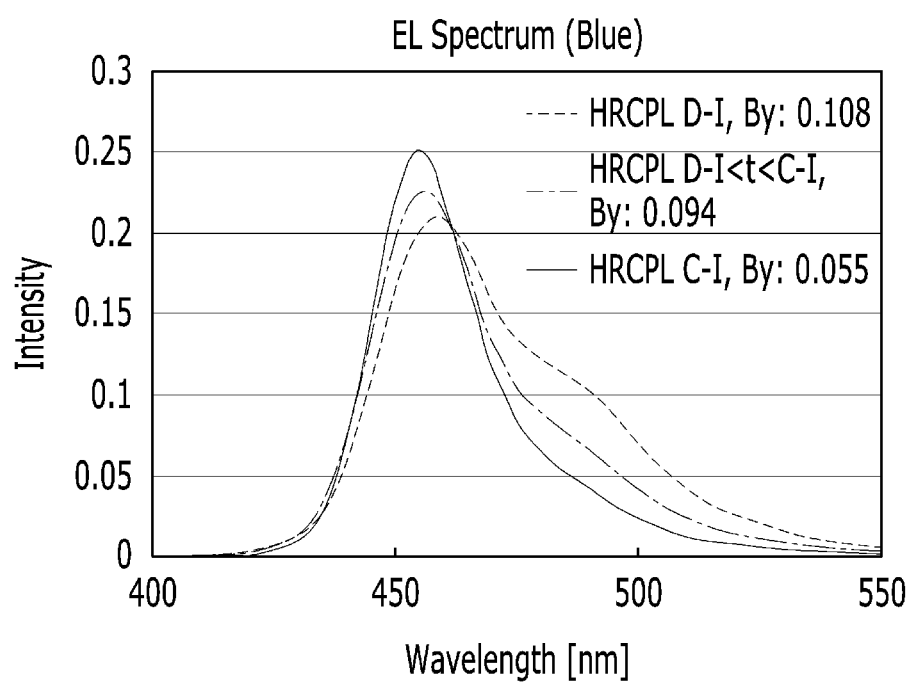

FIGS. 11A and 11B are graphs representing transmittances and spectra in test examples in which a high refractive index capping layer is used as a single capping layer but the high refractive index capping layer is adjusted to have different destructive interference properties and constructive interference properties.

In a test shown in FIG. 11A, the single capping layer having a high refractive index of 2.2 in accordance with the third experimental example was used in common, a first test example (HRCPL D-I) in which the thickness of the capping layer adjusted to exhibit destructive interference properties, a second test example (HRCPL D-I<t<C-I) in which the thickness of the capping layer is adjusted to exhibit properties between destructive interference and constructive interference, and a third test example (HRCPL C-I) in which the thickness of the capping layer is adjusted to exhibit constructive interference properties were prepared, and transmittances of the capping layers of the first, second, and third test examples according to wavelength were measured. As shown in FIG. 11A, the capping layer of the first test example exhibited high transmittance in the blue wavelength range of about 460 nm to 520 nm, the capping layer of the second test example exhibited high transmittance in the green wavelength range of about 520 nm to 590 nm, and the capping layer of the third test example exhibited high transmittance in the red wavelength range of about 620 nm to 630 nm. However, it may be confirmed that, even in any of the first to third test examples, although the properties of the single capping layer are varied between destructive interference and constructive interference, the single capping layer exhibits high transmittance only in a specific wavelength range and exhibits low transmittance in other wavelength ranges, and thus it is difficult for the single capping layer to exhibit uniform transmittance throughout the visible wavelength range. That is, it may be confirmed that all the capping layers of the first to third test examples exhibit non-uniform transmittance in the visible wavelength range.

In a test shown in FIG. 11B, peak wavelength characteristics of blue light in the first to third test examples were examined, and it may be confirmed that, if the single high refractive index capping layer having constructive interference properties is used, the microcavity effect in an organic light emitting diode is increased and an intensity of the peak wavelength is increased, and, as destructive interference of the capping layer is increased, an intensity of the peak wavelength is decreased, a shoulder of the spectrum occurs and thus color distortion of blue light and a CIEy value of color coordinates of blue light are increased. That is, in the capping layer having constructive interference properties of the third test example (HRCPL C-I), a CIEy value (By) of color coordinates is 0.055, in the capping layer having destructive interference properties of the first test example (HRCPL D-I), a CIEy value (By) of color coordinates is 0.108, and, in the capping layer having properties between destructive interference and constructive interference of the second test example (HRCPL D-I<t<C-I), a CIEy value (By) of color coordinates is 0.094.

TABLE 1

| | Condition | Optical characteristics (required luminance) | | | | | |
|---|---|---|---|---|---|---|---|
| Test example | Capping layer properties | Driving voltage (V) | Current density (mA/cm$^2$) | $\eta_J$ (luminance) (cd/A) | CIEx | CIEy | Transmittance/ 460 nm |
| 1$^{st}$ T.E. | HRCPL D-I (t0) | 8.0 | 8.4 | 12.4 (121) | 0.137 | 0.102 | 94% |
| 2$^{nd}$ T.E. | HRCOL(t1)t0 < t1 < t3 | 7.9 | 6.5 | 11.7 (152) | 0.141 | 0.077 | 87% |
| 3$^{rd}$ T.E. | HRCPL C-I (t3) | 7.5 | 4.9 | 10.1 (183) | 0.141 | 0.055 | 79% |
| 4$^{th}$ T.E. | HRCOL (t2) t1 < t2 < t3 | 7.6 | 5.1 | 11.7 (191) | 0.143 | 0.061 | 82% |

Referring to Table 1 above, it may be understood that, as destructive interference properties are increased, transmittance in the blue wavelength range is 94%, but driving voltage is high and distortion of the CIEy value of color coordinates is severe, as in the first test example. For reference, in a fourth test example of Table 1, the thickness of the capping layer is adjusted to t2, which is greater than the thickness of the capping layer of the second test example, and the capping layer has properties between destructive interference and constructive interference. The capping layer of the fourth test example may have the maximum transmittance at a longer wavelength than the capping layer of the second test example. The capping layer of the fourth test example has a thickness between the thickness of the capping layer of the second test example and the thickness of the capping layer of the third test example, and thus have effects, such as driving voltage, current density, transmittance, etc., falling somewhere between the effects of the second and third test examples.

It may be understood that, among the above-described first to fourth test examples, in the third test example in which the single capping layer having low transmittance and constructive interference properties is provided, the least distortion of the CIEy value of color coordinates occurs.

Hereinafter, a test, in which a double-layered capping structure including a high refractive index capping layer and a low refractive index capping layer, as in the transparent display device of the present disclosure, was used in common, a fifth test example in which the thickness of the first capping layer is adjusted to exhibit destructive interference properties and sixth and seventh test examples in which the thickness of the first capping layer is adjusted to exhibit properties between destructive interference and constructive interference were prepared, and optical characteristics of the fifth, sixth, and seventh test examples were compared to the third test example, will be described.

Figure 12B:
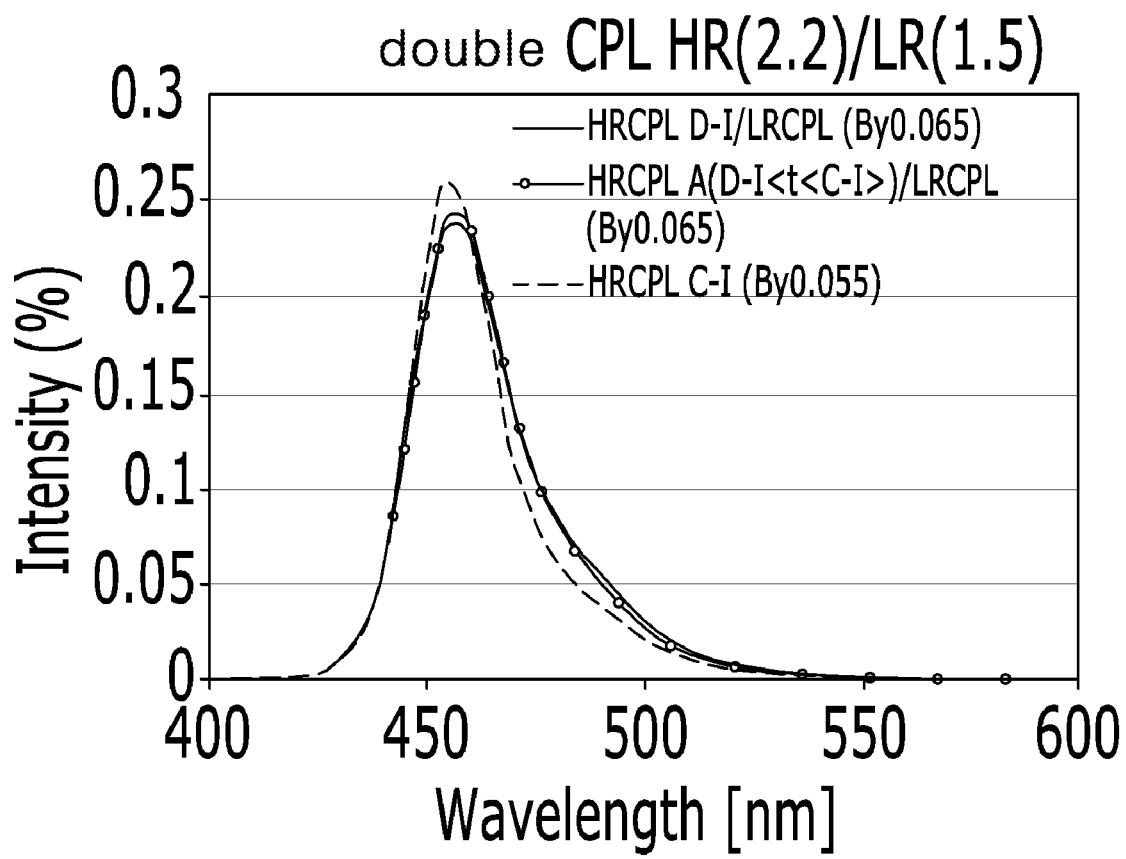

FIGS. 12A and 12B are graphs representing transmittances and spectra of a capping structure formed by stacking a high refractive index capping layer having destructive interference properties and a low refractive index capping layer, another capping structure, and a single high refractive index capping layer having constructive interference characteristics.

Further, from FIG. 12B, it may be confirmed that the single capping layer having constructive interference properties of the third test example has an excellent light intensity at the wavelength of 460 nm, but, as in the transparent display device in accordance with the present disclosure, the double-layered capping structures of the fifth and sixth test examples generate no shoulder in the spectrum, represent peaks at the wavelength of 460 nm, and thus maintain CIEy

TABLE 2

| | Condition | Optical characteristics (required luminance) | | | | | |
|---|---|---|---|---|---|---|---|
| Test example | Capping layer properties | Driving voltage (V) | Current density (mA/cm²) | $\eta_J$ (luminance) (cd/A) | CIEx | CIEy | Transmittance/ 460 nm |
| 3rd T.E. | HRCPL C-I (t3) | 7.5 | 4.9 | 10.1 (183) | 0.144 | 0.055 | 79% |
| 5th T.E. | HRCOL D-I (t4)/LRCPL | 7.6 | 6.1 | 10.5 (162) | 0.141 | 0.065 | 91% |
| 6th T.E. | HRCPL(t5)/LRCPL (t4 < t5) | 7.5 | 5.7 | 10.4 (170) | 0.141 | 0.061 | 86% |
| 7th T.E. | HRCOL (t6)/LRCPL (t5 < t6) | 7.5 | 5.4 | 11.1 (182) | 0.140 | 0.061 | 83% |

As in the fifth to seventh test examples of Table 2, it may be confirmed that, when the double-layered capping structures having different refractive index differences between the capping layers are used, transmittances of all the double-layered capping structures in the blue wavelength range are increased. Particularly, it may be confirmed that, in the fifth test example in which the first capping layer has destructive interference properties, as compared to the sixth and seventh test examples in which the first capping layer has properties between destructive interference and constructive interference, transmittance of the capping structure in the blue wavelength range was increased to 91%, and the capping structure had the highest current density of 6.1 mA/cmz and a CIEy value of 0.065 of color coordinates, which is located within a color purity range of blue light. As shown in FIG. 12A, it may be understood that, among the double-layered capping structures, the double-layered capping structure of the fifth test example has uniform transmittance of 90% or more in the visible wavelength range.

values of 0.065 or less of color coordinates so that distortion in the color coordinates scarcely occurs.

Figure 13A:
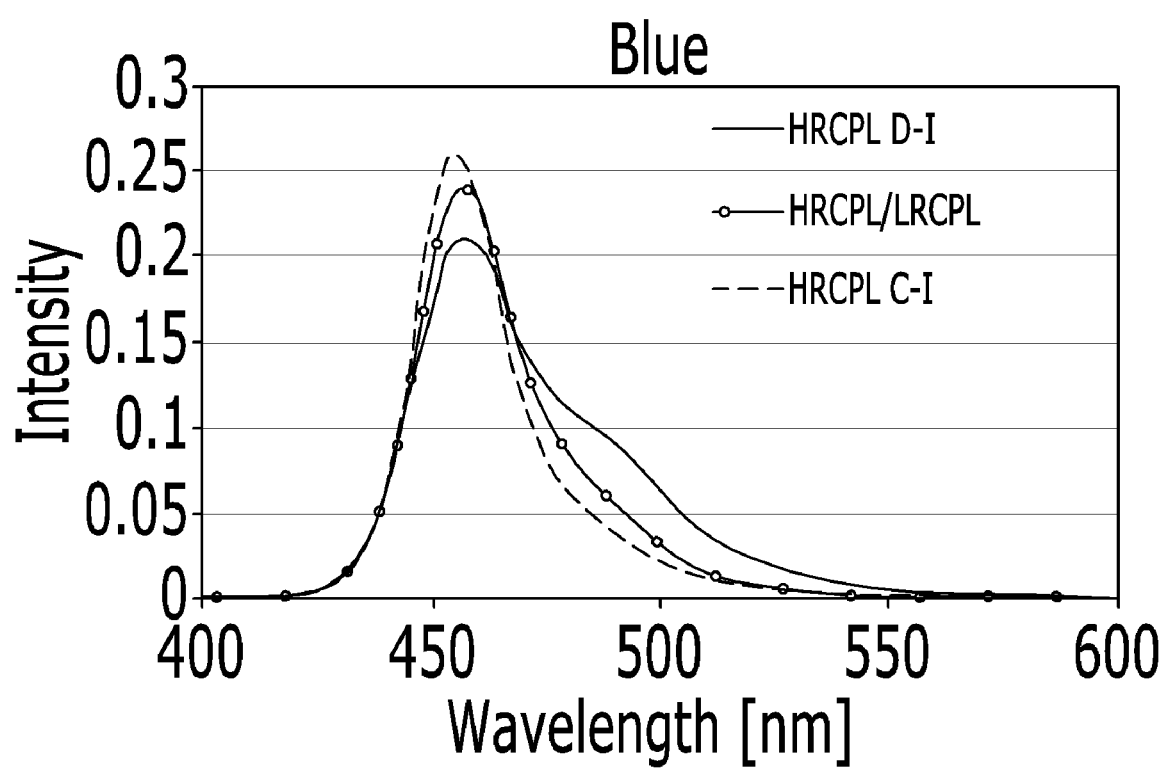
FIGS. 13A to 13C are graphs representing spectra of test examples of a single capping layer having destructive interference properties, a single capping layer having constructive interference properties and the capping structure in accordance with the present disclosure when blue light, green light, and red light are respectively emitted.
Figure 13B:
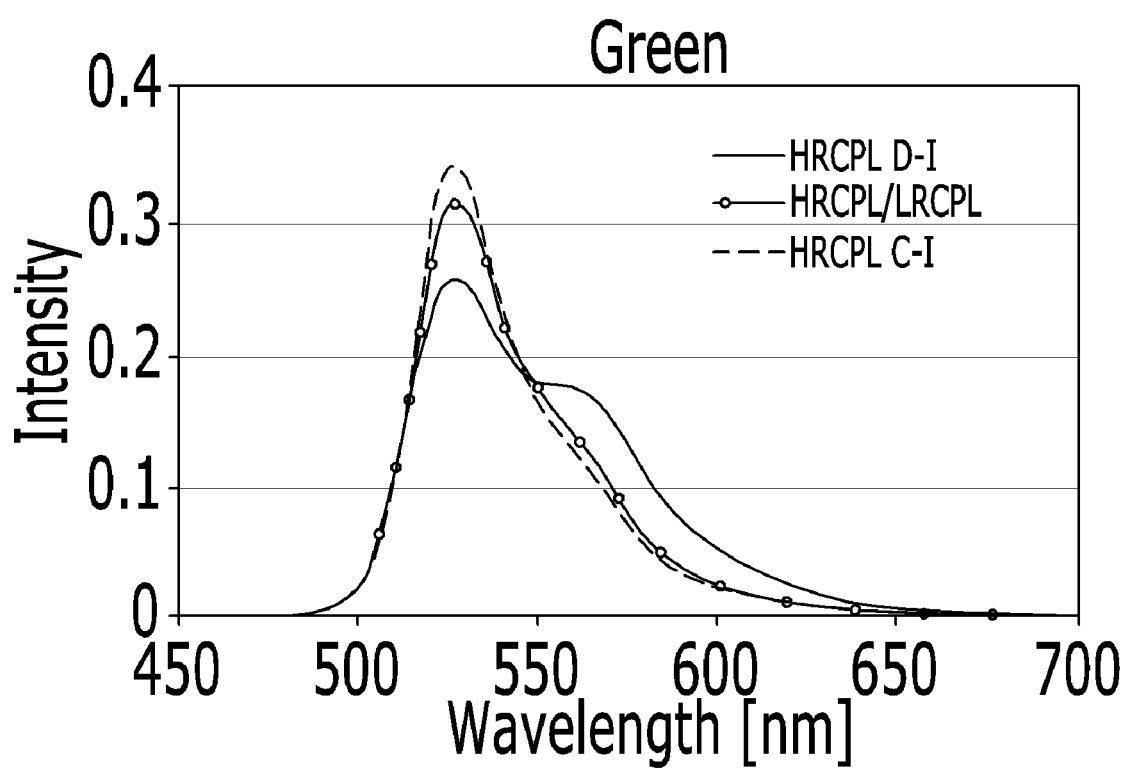
Figure 13C:
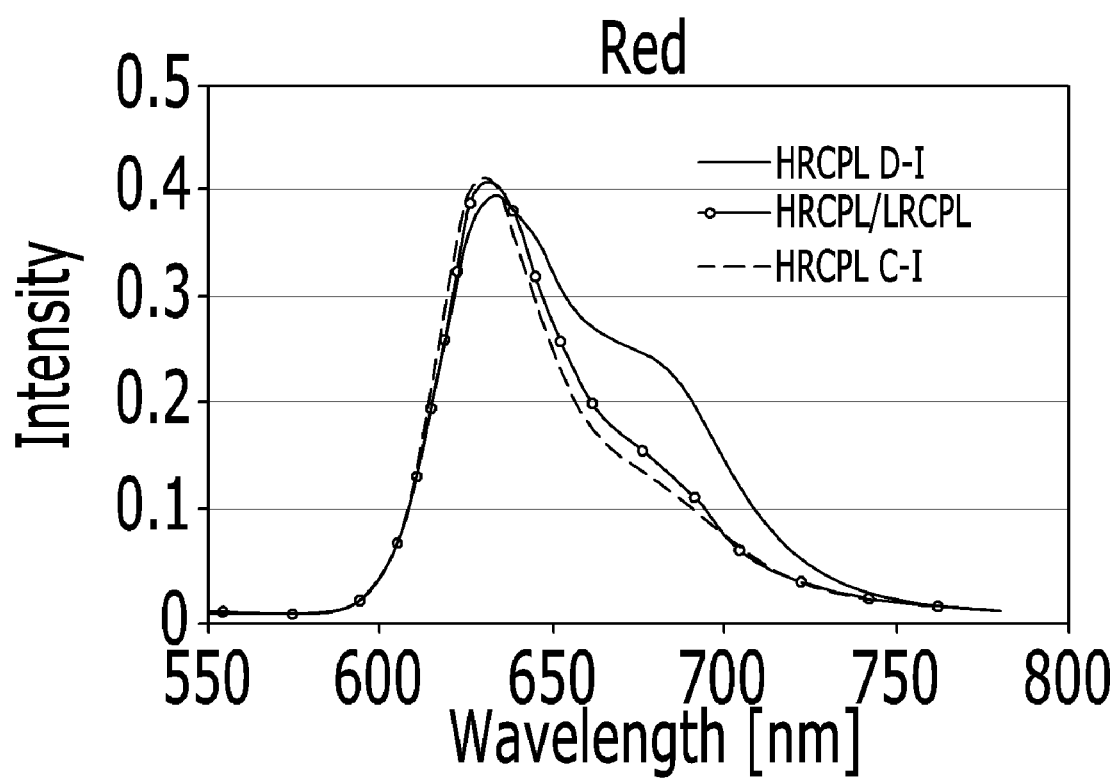

FIGS. 13A to 13C are graphs representing spectra of test examples of a single capping layer having destructive interference properties, a single capping layer having constructive interference properties, and the capping structure in accordance with the present disclosure when blue light, green light, and red light are respectively emitted.

TABLE 3

| | | Optical characteristics (required luminance) | | | | | |
|---|---|---|---|---|---|---|---|
| Condition | | Driving voltage (V) | Current density (mA/cm²) | $\eta_J$ (luminance) (cd/A) | CIEx | CIEy | Transmittance |
| | Capping layer | | | | | | |
| Blue (460 nm) | 3rd T.E. (C-I) | 7.5 | 4.9 | 10.1 (183) | 0.144 | 0.066 | 79% |
| | 1st T.E. (D-I) | 8.0 | 8.4 | 12.4 (121) | 0.137 | 0.102 | 94% |
| | 5th T.E. (HRCPL(D-I)/LRCPL | 7.6 | 6.1 | 10.5 (162) | 0.141 | 0.065 | 91% |
| Green (520 nm) | 3rd T.E. | 6.8 | 3.9 | 219.4 (789) | 0.278 | 0.683 | 83% |
| | 1st T.E. | 7.3 | 6.6 | 1391 (412) | 0.338 | 0.630 | 95% |
| | 5th T.E. | 7.0 | 4.6 | 187.0 (649) | 0.288 | 0.675 | 91% |
| Red (630 nm) | 3rd T.E. | 6.6 | 6.8 | 45.1 | 0.693 | 0.305 | 89% |
| | 1st T.E. | 7.0 | 10.9 | 27.8 | 0.695 | 0.303 | 89% |
| | 5th T.E. | 6.5 | 7.3 | 41.6 | 0.694 | 0.304 | 90% |

Referring to Table 3 and FIGS. 13A to 13C, it may be understood that, when the capping structure formed by stacking the high refractive index capping layer having destructive interference properties and the low refractive index capping layer in accordance with the present disclosure (fifth test example) is applied, as compared to the single capping layer having constructive interference properties (third test example) and the single capping layer having destructive interference properties (first test example), low driving voltage characteristics are acquired, transmittance is much more increased than in the single capping layer having constructive interference properties in which color purity is excellent (third test example), and no color distortion at corresponding wavelengths occurs. Further, as shown in FIGS. 13A to 13C, in the single capping layer having destructive interference properties (first test example), a shoulder occurs at other wavelengths than the emitted wavelength in the respective wavelength ranges, but, in the fifth example of the capping structure in accordance with the present disclosure, no shoulder occurs and thus improvement in efficiency of each color may be confirmed. That is, when the capping structure in accordance with the present disclosure is used, color efficiency may be increased by 30% as compared to the capping layer of the third test example, and correction of color coordinates may be performed as compared to the capping layer of the first test example.

In order to correct color coordinates, the inventor(s) of the present disclosure examined optical characteristics of the third test example (the single capping layer having constructive interference properties), the first test example (the single capping layer having destructive interference properties) and the fifth test example (the capping structure formed by stacking the high refractive index capping layer having destructive interference properties and the low refractive index capping layer) applied to the present disclosure, by substituting a boron-based dopant having deep blue light emitting characteristics for a generally-used pyrene-based blue dopant as a dopant of a blue light emitting layer used in the organic light emitting diode provided under the capping layer.

The boron-based dopant having deep blue light emitting characteristics has a peak wavelength which is lower than the peak wavelength of the pyrene-based blue dopant by 5 nm or more, and a FWHM which is narrower than the FWHM of the pyrene-based blue dopant by 10% or more.

In the above-described test examples stated in Tables 1 to 3, the pyrene-based blue dopant was used as a dopant of the blue light emitting layer, and a peak wavelength of blue light is about 460 nm or longer.

If the boron-based dopant having deep blue light emitting characteristics is used, a peak wavelength of blue light may be 455 nm or shorter, a FWHM may be about 20 to 30 nm, and thus a deep and narrow emitting spectrum may be acquired.

ture in addition to the above-described double-layered capping structure. If a triple-layered or quad-layered capping structure is provided, the triple-layered or quad-layered capping structure is configured such that refractive indexes of respective capping layers are gradually decreased in the upward direction. Further, the optical distances of all the capping layers follow optical distance application in which constructive interference occurs at the blue wavelength when a single capping layer is used, a reflectance difference between interfaces is maintained within a designated range (e.g., 5% or less), and an optical distance difference between the capping layers is maintained within a designated range. Since the capping layers of the capping structure respectively have refractive indexes which are gradually decreased in the upward direction, the upper capping layers have no fluctuation in reflectance according to wavelength characteristics, and thus the triple-layered or quad-layered capping structure may have similar optical characteristics to the double-layered capping structure HRCPL D-I/LRCPL of FIGS. 5 and 6.

Hereinafter, the transparent display device in accordance with the present disclosure will be described in detail in connection with an array formed over the array substrate 100.

Figure 14:
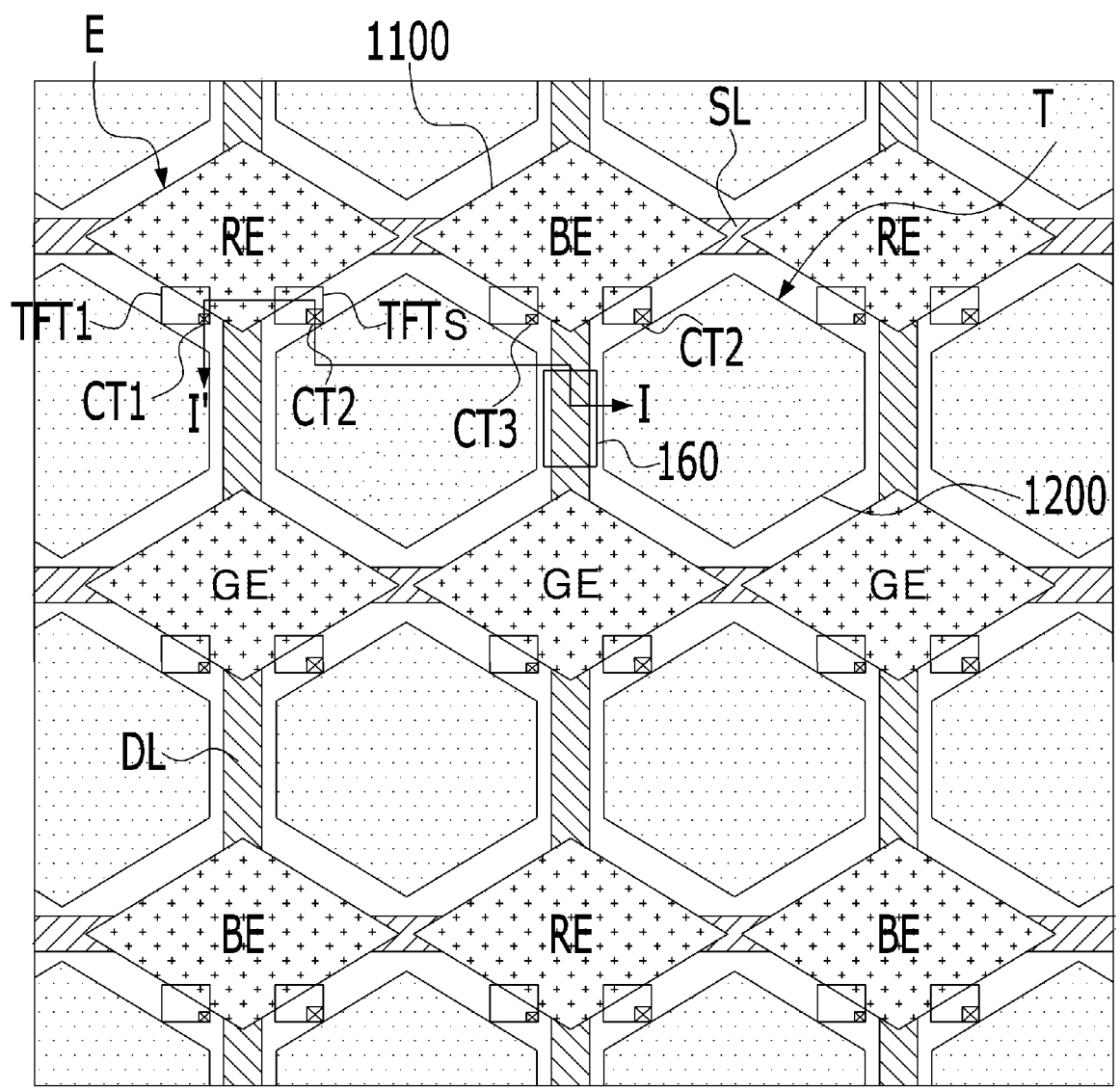
FIG. 14 is a plan view illustrating a transparent display device in accordance with a second embodiment of the present disclosure.
Figure 15:
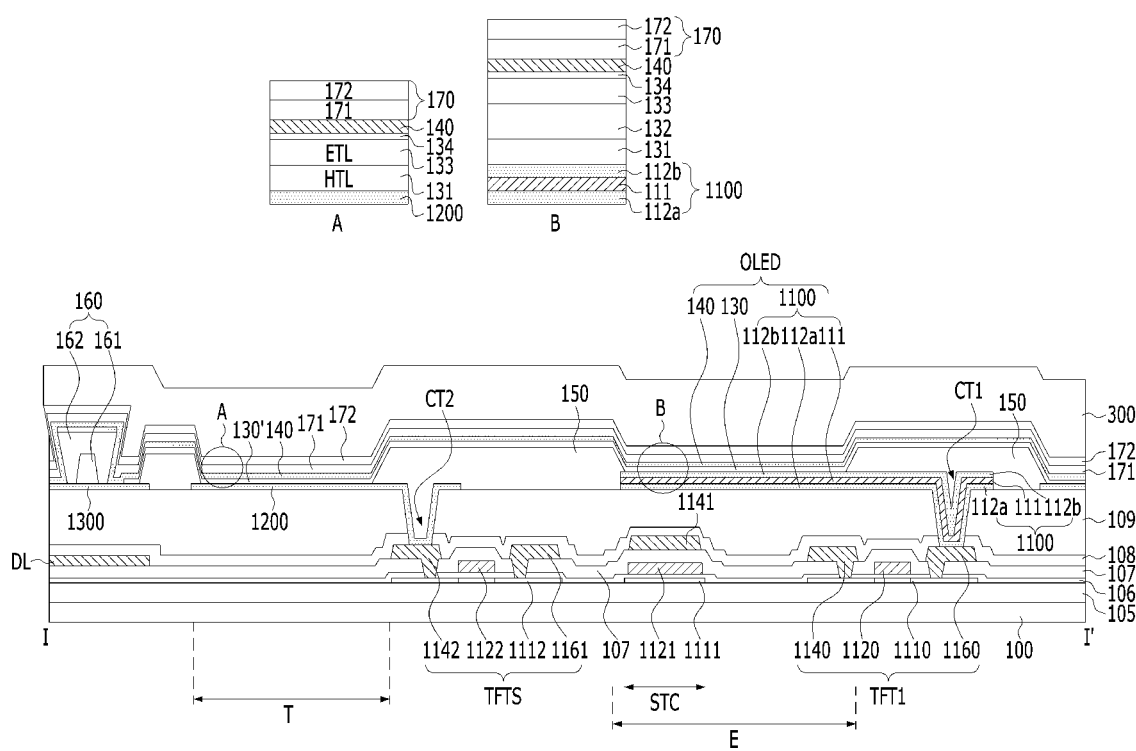
FIG. 15 is a cross-sectional view of FIG. 14, taken along line I-I' according to an embodiment of the present disclosure.

FIG. 14 is a plan view illustrating a transparent display device in accordance with a second embodiment of the present disclosure, and FIG. 15 is a cross-sectional view of FIG. 14, taken along line I-I' according to an embodiment of the present disclosure.

In the transparent display device in accordance with the second embodiment of the present disclosure, emission portions E are provided to correspond to intersecting points between scan lines SL and data lines DL, and transmission portions T are provided between neighboring emission portions E.

TABLE 4

| | Optical characteristics (required luminance) | | | | | | |
|---|---|---|---|---|---|---|---|
| Test example | Driving voltage (V) | Current density (mA/cm²) | η$_J$ (luminance) (cd/A) | CIEx | CIEy | Transmittance/ 460 nm | Transmittance/ 520 nm |
| 3$^{rd}$ T.E. | 7.8 | 4.3 | 12.5 (226) | 0.144 | 0.155 | 79% | 83% |
| 1$^{st}$ T.E. | 8.1 | 8.4 | 12.2 (123) | 0.138 | 0.099 | 95% | 95% |
| 5$^{th}$ T.E. | 7.7 | 5.6 | 11.9 (178) | 0.141 | 0.067 | 91% | 91% |

As in Table 4 which states optical characteristic of the capping layers and the capping structure in accordance with the present disclosure when the boron-based dopant having deep blue light emitting characteristics is used, it may be understood that the capping structure of the present disclosure when the boron-based dopant having deep blue light emitting characteristics is used, has luminance of 178 cd/A which is increased by about 10%, as compared to luminance (162 cd/A) of the capping structure of the present disclosure when a generally-used pyrene-based dopant is used (blue in the fifth test example of Table 3). Further, it may be confirmed that the capping structure of the present disclosure when the boron-based dopant having deep blue light emitting characteristics is used maintains transmittances at the blue and green wavelengths to 90% or higher and may thus have uniform and high transmittance in the visible wavelength range without distortion of color coordinates.

The capping structure of the present disclosure may be provided as a triple-layered or quad-layered capping struc- Since the transmission portions T should be transparent, the transmission portions T are disposed so as not to overlap the wirings SL and DL and thin film transistors TFT1 and TFTS.

In regions other than the emission portions E and the transmission portions T, a bank 150 is formed to overlap elements requiring light shielding, for example, the wirings SL and DL, and to divide neighboring pixel or subpixel regions.

Here, there may be a distance between the emission portion E and the transmission portion T or there may be no distance therebetween, and, if there is no distance between the emission portion E and the transmission portion T, the emission portions E are formed to overlap the wirings SL and DL so that the wirings SL and DL located under organic light emitting diodes OLED in the emission portions E are not visible.

Now, arrangement of colors of emitted light in the transparent display device in accordance with the present disclosure will be described.

Red subpixels RE and blue subpixels BE may be arranged such that the red subpixel RE and the blue subpixel BE are adjacent to each other in the horizontal direction with the transmission portion T provided therebetween, and the red subpixels RE and green subpixels GE may be arranged such that the red subpixels RE and the green subpixels GE are adjacent to each other in the vertical direction. In the illustrated example, the contribution of green light to emission of white light is raised by increasing the number of the green subpixels GE. However, the present disclosure is not limited thereto, and the number of the red subpixels RE or the green subpixels GE may be increased or the same number of the red subpixels RE, the green subpixels GE and the blue subpixels BE may be arranged according to a specific purpose.

As shown in a region A, a transparent electrode 1200, an organic stack 130' including the first common layer 131, the second common layer 133, and the third common layer 134, and the transmissive electrode 140 are disposed in common in the transmission portions T. Further, a capping structure 170 formed by stacking a high refractive index first capping layer 171 having destructive interference properties and a low refractive index second capping layer 172 is provided over the transmissive electrode 140. Since an optical distance $n_2 d_2$ of the second capping layer 172 is the same as an optical distance $n_1 d_1$ of the first capping layer 171 or similar to the optical distance $n_1 d_1$ of the first capping layer 171 such that a difference therebetween is within 10%, the second capping layer 172 may satisfy the condition of destructive interference with respect to a wavelength which is destructively interfered by the first capping layer 171.

As shown in a region B, a reflective anode 1100 having a triple-layered structure formed by stacking transparent electrodes 112a and 112b under and over a reflective electrode 111, an organic light emitting diode OLED including a hole-transporting first common layer 131, an organic light emitting layer 132, an electron-transporting second common layer 133, an electron-injecting third common layer 134, and a transmissive electrode 140 provided as a thin transflective or transparent electrode formed of silver or a silver alloy, which are sequentially stacked over the reflective anode 1100, and the above-described capping structure 170 including the first capping layer 171 and the second capping layer 172 formed over the organic light emitting diode OLED are provided in the emission portion E.

The transparent electrode 1200 of the transmission portion T may include only one of the upper and lower transparent electrodes 112b and 112a, and the reflective anode 1200 of the emission portion E may include one or both of the upper and lower transparent electrodes 112b and 112a with the reflective electrode 111. In some cases, the transparent electrode 1200 of the transmission portion T may include both of the upper and lower transparent electrodes 112b and 112a.

In the present disclosure, the wavelength of emitted red light is in the range of 600 nm to 650 nm, the wavelength of emitted blue light is in the range of 430 nm to 460 nm, and the wavelength of emitted green light is in the range of 510 nm to 590 nm. That is, the red subpixels RE, the blue subpixels BE and the green subpixels GE emit light of different colors.

In an example illustrated in FIG. 14, one pixel may include the red, green, and blue subpixels RE, GE, and BE which are adjacent to one another in the vertical direction, and three transmission portions T which are respectively adjacent to the red, green, and blue subpixels RE, GE, and BE, and a plurality of pixels may be arranged in a matrix over the transparent substrate 100. The respective emission portions E and transmission portions T are connected to the first thin film transistors TFT1 and the second thin film transistors TFT2, and may thus functions as subpixels which are independently driven. Although the example illustrates that the transparent electrode 1200 is provided in the transmission portion T and thus the transmission portion T may be driven by the second thin film transistor TFTS, the transparent electrode 1200 and the second thin film transistor TFTS may be omitted from the transmission portion T. If the second thin film transistor TFTS is provided for the transmission portion T, as shown in FIGS. 14 and 15, the transmission portion T may be selectively driven as needed. In this case, in order to add light emitting characteristics according to selective driving, a light emitting layer may be further provided in the transmission portion T.

The transparent electrode 1200 of the transmission portion T may be provided by leaving only the transparent electrode layer among the reflective anode 1100 provided in the emission portion E.

A red organic light emitting layer 132 is provided in each red subpixel RE, a blue organic light emitting layer 132 is provided in each blue subpixel BE, and a green organic light emitting layer 132 is provided in each green subpixel GE.

The first thin film transistor TFT1 in the emission portion E includes a first gate electrode 1120 formed in the same layer as the scan lines SL, a first semiconductor layer 1110 provided with a channel region overlapping the first gate electrode 1120, and a first source electrode 1140 and a first drain electrode 1160 connected to both sides of the first semiconductor layer 1110. Further, the first gate electrode 1120 may be formed as a protrusion pattern protruding from the scan line SL to be formed integrally with the scan line SL. The first source electrode 1140 may be formed as a protrusion pattern protruding from the data line DL, and the first drain electrode 1160 is spaced apart from the first source electrode 140 and connected to the reflective anode 1100 of the organic light emitting diode OLED through a first connection part CT1.

The second thin film transistor TFTS may be formed through the same process as the first thin film transistor TFT1, and thus includes a second gate electrode 1122 formed in the same layer as the scan lines SL, a second semiconductor layer 1112 provided with a channel region overlapping the second gate electrode 1122, and a second source electrode 1161 and a second drain electrode 1142 connected to both sides of the second semiconductor layer 1112. Further, the second gate electrode 1122 may be formed as a protrusion pattern protruding from the scan line SL to be formed integrally with the scan line SL, or formed as a protrusion pattern protruding from another scan line ASL (not shown) which is separately provided. Here, if the second gate electrode 1122 is formed from or connected to the separate scan line ASL, the second thin film transistor TFTS may attempt to be driven at a different point in time from the first thin film transistor TFT1. The second source electrode 1161 may be formed as a protrusion pattern protruding from the data line DL, and, in this case, the data line DL to which the second source electrode 1161 is connected may be a different data line DL from the data line DL to which the first thin film transistor TFT1 is connected. Further, the second drain electrode 1142 is spaced apart from the data line DL and the second source electrode 1161, and the second drain electrode 1142 is connected to the transparent electrode 1200 of the transmission portion T through a second connection part CT2.

Referring to FIG. 15, the layered structure of the transparent display device will be described in detail, as follows.

A buffer layer 105 is provided over the transparent substrate 100, and first, second, and third semiconductor layers 1110, 1112, and 1111 are provided over the buffer layer 105. The buffer layer 105 serves to prevent impurities remaining in the transparent substrate 100 from being introduced into the semiconductor layers 1110, 1112, and 1111. The semiconductor layers 1110, 1112, and 1111 may be amorphous or crystalline silicon semiconductor layers, or transparent oxide semiconductor layers. Further, both sides of the first and second semiconductor layers 1110 and 1112 connected to the first and second source electrodes 1140 and 1161 and the first and second drain electrodes 1160 and 1142 may be regions into which impurities are injected, and intrinsic regions of the first and second semiconductor layers 1110 and 1112 between the impurity injected regions may function as the channel regions.

The third semiconductor layer 1111 may be located to overlap storage electrodes 1121 and 1141 which will be formed thereon, and be used as an auxiliary storage electrode which increases the capacitance of a storage capacitor STC if impurities are injected. Otherwise, as circumstances require, the third semiconductor layer 1111 may be omitted.

Further, a gate insulating film 106 is provided to overlay the first to third semiconductor layers 1110, 1112, and 1111, and the first and second gate electrodes 1120 and 1122 and the first storage electrode 1121 respectively overlapping the intrinsic regions of the first and second semiconductor layers 1110 and 1112 and the third semiconductor layer 1111 are formed.

A first interlayer insulating film 107 is provided to overlay the first, second, and third semiconductor layers 1110, 1112, and 1111, the first and second gate electrodes 1120 and 1122 and the first storage electrode 1121.

Contact holes are formed by selectively removing the first interlayer insulating film 107 and the gate insulating film 106 from both sides of the first semiconductor layer 1110 and the second semiconductor layer 1112, and the first source electrode 1140 and the first drain electrode 1160 are connected to the first semiconductor layer 1110 and the second source electrode 1161 and the second drain electrode 1142 are connected to the second semiconductor layer 1112 through the contact holes. In the same process, the second storage electrode 1141 is formed over the first interlayer insulating film 107 overlapping the first storage electrode 1121.

Here, the first thin film transistor TFT1 to drive the first organic light emitting diode OLED provided in the emission portion E includes the first semiconductor layer 1110, the first gate electrode 1120 provided with the channel region overlapping the first semiconductor layer 1110, and the first source electrode 1140 and the first drain electrode 1160 connected to both sides of the first semiconductor layer 1110, which are sequentially stacked from below. The second thin film transistor TFTS to drive a second organic light emitting diode provided in the transmission portion T does not overlap the transmission portion T, and has the same layered structure of the first thin film transistor TFT1, i.e., includes the second semiconductor layer 1112, the second gate electrode 1122 provided with the channel region overlapping the second semiconductor layer 1112, and the second source electrode 1161 and the second drain electrode 1142 connected to both sides of the second semiconductor layer 1112, which are sequentially stacked from below.

Further, the storage capacitor STC includes the first and second storage electrodes 1121 and 1141 overlapping each other with the first interlayer insulating film 107 interposed therebetween.

A second interlayer insulating film 108 is formed to overlay the first and second thin film transistors TFT1 and TFTS and the storage capacitor STC.

Here, the first and second thin film transistors TFT1 and TFTS and the storage capacitor STC include light-shielding metal layers and are disposed so as not to overlap the transmission portion T, and thus, the first and second thin film transistors TFT1 and TFTS may be disposed so as to overlap the emission portion or a region for forming the bank 150. Here, the bank 150 may be located between the transmission portion T and the emission portion E, or be located between emission areas of the emission portions E which are spaced apart from each other. In the emission portion E, the reflective anode 1100 allows the metal layers disposed thereunder to be invisible and, in a region where the bank 50 is located, the thick bank 50 allows the elements disposed thereunder to be invisible.

Further, a planarization film 109 may be formed to planarize the surface of the second interlayer insulating film 108 while overlaying the second interlayer insulating film 108, the first and second connection parts CT1 and CT2 may be formed by selectively removing the planarization film 109 and the second interlayer insulating film 108, and the first and second thin film transistors TFT1 and TFTS may be connected to the reflective anode 1100 and the transparent electrode 1200 through the first and second connection parts CT1 and CT2.

The transparent display device in accordance with the present disclosure may further include a barrier rib 160 in designated regions of portions where the transmission portions T and the emission portions E are not located, and the barrier rib 160 may divide the adjacent transmission portions T or emission portions E. The barrier rib 160 prevents a deposition mask (not shown) used for deposition of an organic material when the organic stacks 130 and 130' are formed from directly contacting the bank 150, and thus maintains the form of the bank 150 without collapse of the bank 150.

The barrier rib 160 includes a first layer 161 formed in the same layer as the bank 150 and a second layer 162 having a designated height from the upper surface of the first layer 161 so as to overlay the first layer 161. In order to prevent the deposition mask, required to form the organic common layer or the light emitting layer, from directly contacting the bank 150 or sagging after formation of the bank 150, the second layer 162 may be formed in the same layer as a spacer (not shown) formed over the bank 150. An encapsulation layer 300 is formed over the capping structure 170.

In the emission portion E, the reflective anode 1100 and the transmissive electrode 140 are disposed opposite to each other. Here, the reflective anode 1100 is illustrated as having a three-layered structure having the reflective electrode layer 111 and the upper and lower transparent electrode layers 112b and 112a, but is not limited thereto. That is, one or both of the transparent electrode layers 112b and 112a may be omitted, or a plurality of transparent electrode layers 112b and 112a and a plurality of reflective electrode layers 111 may be provided. If the reflective anode 1100 includes at least one transparent electrode layer, the transparent electrode 1200 in the transmission portion T may be formed through the same process as the transparent electrode layer. Also, the transparent electrode 140 is in contact with an auxiliary electrode 1300 which is in a same layer with the reflective anode 1100. The auxiliary electrode 130 is spaced from the reflective anode 1100.

Although the above-described example describes the organic light emitting diode OLED provided in the emission portion E as a single stack including a single organic light emitting layer in each subpixel, an organic light emitting diode including a plurality of stacks, each of which includes a light emitting layer, is applicable to the transparent display device in accordance with the present disclosure.

Figure 16:
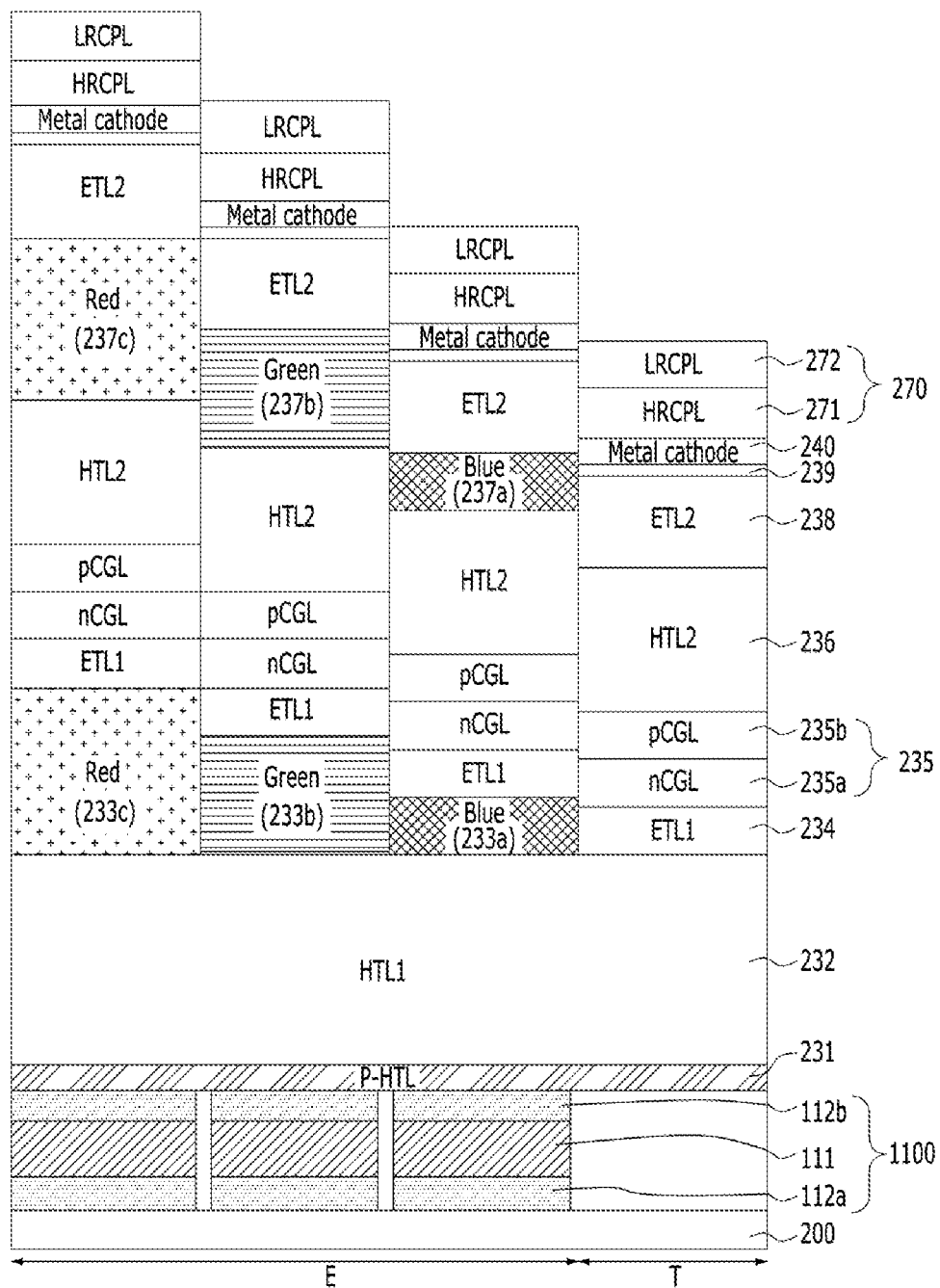
FIG. 16 is a cross-sectional view illustrating a transparent display device in accordance with a third embodiment of the present disclosure.

FIG. 16 is a cross-sectional view illustrating a transparent display device in accordance with a third embodiment of the present disclosure.

As shown in FIG. 16, the transparent display device in accordance with the third embodiment of the present disclosure is divided into emission portions E and transmission portions T. In a subpixel of each emission portion E over a substrate 200 including thin film transistors, a reflective anode 1100 connected to each thin film transistor is provided, an organic stack including a hole injection layer 231, a first hole transport layer 232, a first organic light emitting layer 233a, 233b or 233c, a first electron transport layer 234, a charge generation layer 235 formed by stacking an n-type charge generation layer (nCGL) 235a and a p-type charge generation layer (pCGL) 235b, a second hole transport layer 236, a second organic light emitting layer 237a, 237b, and 237c, a second electron transport layer 238 and an electron injection layer 239, which are sequentially stacked over the reflective anode 1100, is provided, and a transmissive electrode 240 having transflective properties and a small thickness is provided over the organic stack, thereby forming an organic light emitting diode.

Although this embodiment illustrates that the organic stack is a two-stack structure divided into a first stack located at a lower region and a second stack located at an upper region based on the charge generation layer 235, the organic stack is not limited thereto, and one or more stacks, each of which includes a hole transport layer, an organic light emitting layer and an electron transport layer, may be further provided over the second electron transport layer 238.

Further, this embodiment describes an example in which the organic light emitting layers to emit light of the same color are applied to the respective stacks in order to improve color efficiencies of red, green, and blue light.

Further, the first organic light emitting layers 233a, 233b, and 233c and the second organic light emitting layers 237a, 237b, and 237c to emit light of respective colors are set to have different thicknesses so as to achieve optimum resonance of light of the respective colors.

In the transmission portion T provided adjacent to the emission portion E, the hole injection layer 231, the first electron transport layer 234, the charge generation layer 235 formed by stacking the n-type charge generation layer (nCGL) 235a, and the p-type charge generation layer (pCGL) 235b, the second hole transport layer 236, the second electron transport layer 238 and the electron injection layer 239 are stacked, as common elements of an organic stack.

Further, the transmissive electrode 240 and a capping structure 270 formed by stacking a high refractive index first capping layer 271 having destructive interference properties and a low refractive index second capping layer 272 are applied in common onto the organic stacks in the emission portion E and the transmission portion T.

As described above, the capping structure 270 is characterized in that a refractive index difference at the interface between the respective capping layers 271 and 172 is small, a refractive index difference at the interface between the upper surface of the second capping layer 272 and an encapsulation layer outside the second capping layer 272 is small, and thus an amount of light transmitted by the capping structure 270 may be increased due to the anti-reflection effect through low reflectances of the respective interfaces. Further, color efficiency may be improved through destructive interference properties without distortion of color coordinates.

Although the above-described embodiments illustrate the capping structure as a two-layered structure including the first capping layer and the second capping layer, the capping structure is not limited thereto, and may have a three or more-layered structure. However, the capping structure is provided over the transmissive electrode in the transmission portion, and has a total thickness of 2,000 Å or less in consideration of shielding of light.

Light emitted through the organic light emitting diode OLED is sequentially transmitted by the transmissive electrode, the first capping layer and the second capping layer, and an amount of light transmitted by the second capping layer may be proportional to a value acquired by subtracting reflectance of the transmissive electrode, reflectance of the interface between the first capping layer and the second capping layer and reflectance of the upper surface of the second capping layer from 1, on the assumption that the total amount of light emitted through the organic light emitting diode is 1.

In the transparent display device of the present disclosure, the two different emission portions may be adjacent to one transmission portion.

Also, one transmission portion may be surrounded by four emission portions.

Furthermore, a shape of the transmission portion may be hexagonal or diamond.

Also, two green emission portions, one red emission portion, and one blue emission portion may surround each transmission portion.

The red or blue emission portions may diagonally correspond to the green emission portion with a transmission portion therebetween.

In the present disclosure, the TFT may be overlapped with the emission portion outside the transmission portion.

Also, the transmissive electrode may be in contact with an auxiliary electrode (refer 1300 of FIG. 15) which is in a same layer with the anode.

The transparent display device of the present disclosure may further comprise a bank to define the emission portion and the transmission portion and a spacer on the bank, wherein the bank has a positive taper and the spacer has a negative taper.

Also, a transparent display device according to another embodiment may comprise a reflective electrode structure over a substrate, an organic light emitting layer over the reflective electrode structure, a transmissive electrode over the organic light emitting layer and a capping structure comprising a first capping layer over the transmissive electrode and having destructive interference properties and a first refractive index, and a second capping layer having a second refractive index less than the first refractive index over the first capping layer.

Also, the transparent display device according to another embodiment has the following features, such that the substrate has a plurality of pixels, an emission portion and a transmission portion are in each of the pixels, the reflective electrode structure is between the organic light emitting layer and the substrate, in the emission portion; and the capping structure is over the emission portion and the transmission portion, throughout the pixels over the substrate and the second capping layer.

As apparent from the above description, a transparent display device in accordance with the present disclosure has effects as follows.

First, a capping structure formed by stacking a high refractive index first capping layer having destructive interference properties and a low refractive index second capping layer is applied in common to emission portions and transmission portions, and thus, a refractive index difference at the interface between the respective capping layers is small, a refractive index difference at the interface between the upper surface of the second capping layer and an encapsulation layer outside the second capping layer is small, and thereby an amount of light transmitted by the capping structure may be increased due to the anti-reflection effect through low reflectances of the respective interfaces.

Second, the interference effect of the double-layered capping structure is optimized and the first and second capping layers have the same optical distance or similar optical distances, and thus color efficiency may be improved due to increase in transmittance through destructive interfere with respect to wavelengths in similar ranges without distortion of color coordinates.

Third, through change in the thickness of a second electrode and the structure of the capping structure, a high-efficiency transparent light emitting diode may be implemented without change in the internal configuration of the light emitting diode.

Fourth, high transmittance of the transmission portion may be secured, and an EL spectrum of the emission portion may be optimized.

Fifth, uniform transmittance in the visible wavelength range may be secured.

It will be apparent to those skilled in the art that various modifications and variations can be made in the present invention without departing from the spirit or scope of the invention. Thus, it is intended that the present invention include the modifications and variations of this invention provided they come within the scope of the appended claims and their equivalents.

What is claimed is:
1. A transparent display device comprising:
a substrate having a plurality of pixels;
at least one emission portion and at least one transmission portion in each of the pixels;
an organic light emitting layer in the emission portion;
a reflective electrode structure between the organic light emitting layer and the substrate, in the emission portion;
a transmissive electrode located over the emission portion and the transmission portion, throughout the pixels over the substrate;
a capping structure on the transmissive electrode at the transmission portion and the emission portion, the capping structure comprising a first capping layer in contact with the transmissive electrode, and a second capping layer in contact with the first capping layer, and
an encapsulation layer in contact with the second capping layer,
wherein a light reflected downward at an interface between the transmissive electrode and the capping structure is canceled out with a light reflected downward at an interface between the capping structure and the encapsulation layer,
wherein the first capping layer has a first refractive index $n1$ and the second capping layer has a second refractive index $n2$ less than the first refractive index $n1$.

2. The transparent display device according to claim 1, wherein the first refractive index is 2.0 or more, and the second capping layer is less than the first refractive index by 0.2 to 1.2.

3. The transparent display device according to claim 2, wherein the first refractive index is 2.0 to 2.7, and the second refractive index is 1.3 to 2.0.

4. The transparent display device according to claim 1, wherein:
the first capping layer has a first thickness $d_1$, and
a first optical distance $n_1 d_1$ of the first capping layer has a value of $m\lambda/2 \cos\theta$, wherein m is an integral, $\lambda$ is a destructively interfered wavelength and $\theta$ is an angle of incidence.

5. The transparent display device according to claim 4, wherein the destructively interfered wavelength is a blue wavelength or a deep blue wavelength, and
wherein a peak wavelength of the destructively interfered wavelength is in the range of 430 nm to 465 nm.

6. The transparent display device according to claim 1, wherein:
the first capping layer has a first thickness $d_1$;
the second capping layer has a second thickness $d_2$, and
a second optical distance $n_2 d_2$ of the second capping layer is 0.9 to 1.1 times the first optical distance $n_1 d_1$.

7. The transparent display device according to claim 6, wherein:
the first thickness is 250 Å to 500 Å, and
the second thickness is 300 Å to 700 Å.

8. The transparent display device according to claim 1, wherein a difference between a reflectance of an upper surface of the second capping layer and a reflectance of an interface between the first capping layer and the second capping layer is within 5%.

9. The transparent display device according to claim 1, wherein reflectance of the interface between the second capping layer and the encapsulation layer $$\left(\frac{n_2 \cos\theta_i - n_{Encap}\cos\theta_t}{n_2 \cos\theta_i + n_{Encap}\cos\theta_t}\right)^2,$$

is wherein $n_{Encap}$ is a refractive index of the encapsulation layer, $\theta_i$ is an angle of incidence and $\theta_t$ is an angle of exit.

10. The transparent display device according to claim 9, wherein the reflectance of the interface between the second capping layer and the encapsulation layer is 5% or less,
wherein a reflectance of an interface between the first capping layer and the second $$\left(\frac{n_1 \cos\theta_i - n_2 \cos\theta_t}{n_1 \cos\theta_i + n_2 \cos\theta_t}\right)^2,$$

capping layer is
wherein a difference between the reflectance of the interface between the first capping layer and the second capping layer and the reflectance of the interface between the second capping layer and the encapsulation layer is 5% or less.

11. The transparent display device according to claim 1, wherein:
light emitted through an upper surface of the organic light emitting layer is sequentially transmitted by the transmissive electrode, the first capping layer, and the second capping layer, and
wherein an amount of light transmitted by the second capping layer is proportional to a value acquired by subtracting a reflectance of the transmissive electrode, a reflectance of the interface between the first capping layer and the second capping layer, and a reflectance of the interface between the second capping layer and the encapsulation layer from a total amount of light emitted through the upper surface of the organic light emitting layer.

12. The transparent display device according to claim 1, wherein the transmissive electrode is formed of a silver alloy, and a thickness of the transmissive electrode is 50 Å to 100 Å.

13. The transparent display device according to claim 1, wherein the organic light emitting layer is further provided in the transmission portion, and the organic light emitting layer in the transmission portion functions as a subpixel which is independently driven with the organic light emitting layer in the emission portion.

14. The transparent display device according to claim 1, wherein two different emission portions are adjacent to one transmission portion, or
wherein one transmission portion is surrounded by four emission portions, or
wherein a shape of the transmission portion is hexagonal or diamond.

15. The transparent display device according to claim 1, wherein two green emission portions, one red emission portion, and one blue emission portion surround each transmission portion, or
wherein red or blue emission portions diagonally correspond to the green emission portion with the transmission portion therebetween.

16. The transparent display device according to claim 1, wherein, a thin film transistor (TFT) is overlapped with the emission portion outside the transmission portion, or
wherein the transmissive electrode is in contact with an auxiliary electrode which is in a same layer with the anode.

17. The transparent display device according to claim 1, further comprising a bank to define the emission portion and the transmission portion and a spacer on the bank, wherein the bank has a positive taper and the spacer has a negative taper.

18. A transparent display device comprising:
a reflective electrode structure over an emission portion of a substrate;
an organic light emitting layer over the reflective electrode structure;
a transmissive electrode over the emission portion and a transmission portion of the substrate, the transmissive electrode above the organic light emitting layer at the emission portion; and
a capping structure on the transmissive electrode, the capping structure comprising a first capping layer in contact with the transmissive electrode and a second capping layer in contact with the first capping layer; and
an encapsulation layer in contact with the second capping layer,
wherein a light reflected downward at an interface between the transmissive electrode and the capping structure is canceled out with a light reflected downward at an interface between the capping structure and the encapsulation layer,
wherein the first capping layer has a first refractive index and the second capping has a second refractive index less than the first refractive index.

19. The transparent display device according to claim 18, wherein the emission portion comprises a red subpixel, a green subpixel and a blue subpixel, and the red, green and blue subpixels have red, green and blue light emitting layers in the organic light emitting layer,
wherein the reflective electrode structure is between the organic light emitting layer and the substrate, in the emission portion
wherein the transmissive electrode and the capping structure is provided without any opening over the emission portion and the transmission portion.

20. The transparent display device according to claim 18, further comprising a first common layer, a second common layer and a third common layer over the emission portion and the transmission portion, wherein at the emission portion, the first common layer is below the organic light emitting layer at the emission portion, and the second common layer and the third common layer are on the organic light emitting layer,
wherein an area of the capping structure is greater than an area of the transmissive electrode.

* * * * *